US010796948B2

(12) United States Patent
Mitra et al.

(10) Patent No.: US 10,796,948 B2
(45) Date of Patent: Oct. 6, 2020

(54) PATTERN FORMING METHOD AND IMPRINT APPARATUS

(71) Applicant: TOSHIBA MEMORY CORPORATION, Tokyo (JP)

(72) Inventors: Anupam Mitra, Yokohama Kanagawa (JP); Tetsuro Nakasugi, Yokohama Kanagawa (JP); Kazuhiro Takahata, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/570,202

(22) Filed: Sep. 13, 2019

(65) Prior Publication Data

US 2020/0006124 A1    Jan. 2, 2020

Related U.S. Application Data

(62) Division of application No. 15/694,951, filed on Sep. 4, 2017, now abandoned.

(30) Foreign Application Priority Data

Nov. 25, 2016 (JP) ................... 2016-229520

(51) Int. Cl.
| H01L 21/768 | (2006.01) |
| H01L 21/027 | (2006.01) |
| H01L 21/311 | (2006.01) |
| G03F 7/00 | (2006.01) |
| H01L 27/11529 | (2017.01) |
| H01L 27/11573 | (2017.01) |

(52) U.S. Cl.
CPC ...... *H01L 21/76817* (2013.01); *G03F 7/0002* (2013.01); *H01L 21/0271* (2013.01); *H01L 21/0274* (2013.01); *H01L 21/31144* (2013.01); *H01L 21/76816* (2013.01); *H01L 21/76877* (2013.01); *H01L 27/11529* (2013.01); *H01L 27/11573* (2013.01)

(58) Field of Classification Search
CPC .............. G03F 7/0002; H01L 21/0271; H01L 21/76816; H01L 21/76817; H01L 21/76877; H01L 27/11529; H01L 27/11573; H01L 21/0274; H01L 21/31144
See application file for complete search history.

(56) References Cited

U.S. PATENT DOCUMENTS

| 8,187,797 B2 | 5/2012 | Shiobara et al. |
| 8,597,873 B2 * | 12/2013 | Kawamura ......... H01L 21/0271 |
| | | 430/322 |
| 10,031,414 B2 * | 7/2018 | Isobayashi ............ G03F 7/0002 |
| 2010/0104984 A1 * | 4/2010 | Shiobara ................ B82Y 40/00 |
| | | 430/319 |

(Continued)

FOREIGN PATENT DOCUMENTS

| JP | 5100609 B2 | 12/2012 |
| JP | 5161707 B2 | 3/2013 |
| WO | 2014076922 A1 | 5/2014 |

*Primary Examiner* — Deoram Persaud
(74) *Attorney, Agent, or Firm* — Kim & Stewart LLP

(57) ABSTRACT

A pattern forming method includes forming a first resist pattern on a substrate using imprint lithography. And forming a resist onto the substrate at least at positions corresponding to a second resist pattern and then curing the resist to form the second resist pattern on the substrate.

20 Claims, 23 Drawing Sheets

(56) References Cited

U.S. PATENT DOCUMENTS

| | | | |
|---|---|---|---|
| 2010/0140220 A1 | 6/2010 | Cho et al. | |
| 2010/0187714 A1* | 7/2010 | Kobiki | B82Y 10/00 |
| | | | 264/135 |
| 2013/0240480 A1* | 9/2013 | Suzuki | G03F 7/16 |
| | | | 216/41 |
| 2015/0093897 A1 | 4/2015 | Koh et al. | |
| 2016/0299423 A1* | 10/2016 | Yeo | G03F 7/0002 |
| 2016/0306275 A1* | 10/2016 | Park | G03F 7/0002 |
| 2016/0320696 A1* | 11/2016 | Nishimura | G03F 7/0002 |
| 2018/0151418 A1* | 5/2018 | Mitra | H01L 21/76817 |
| 2018/0164680 A1* | 6/2018 | Mitra | H01L 21/31144 |

* cited by examiner

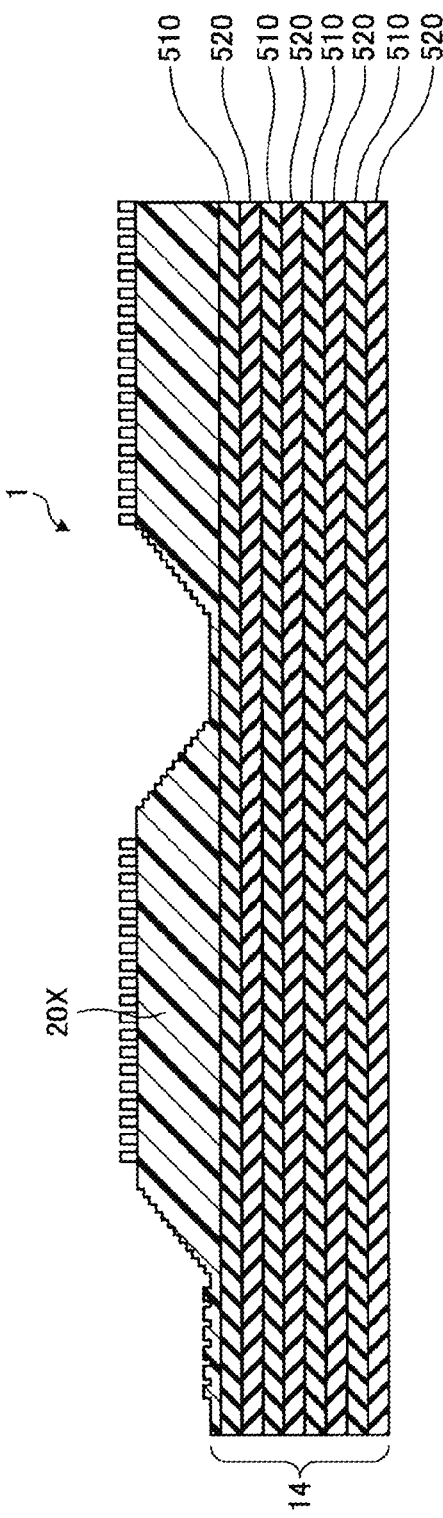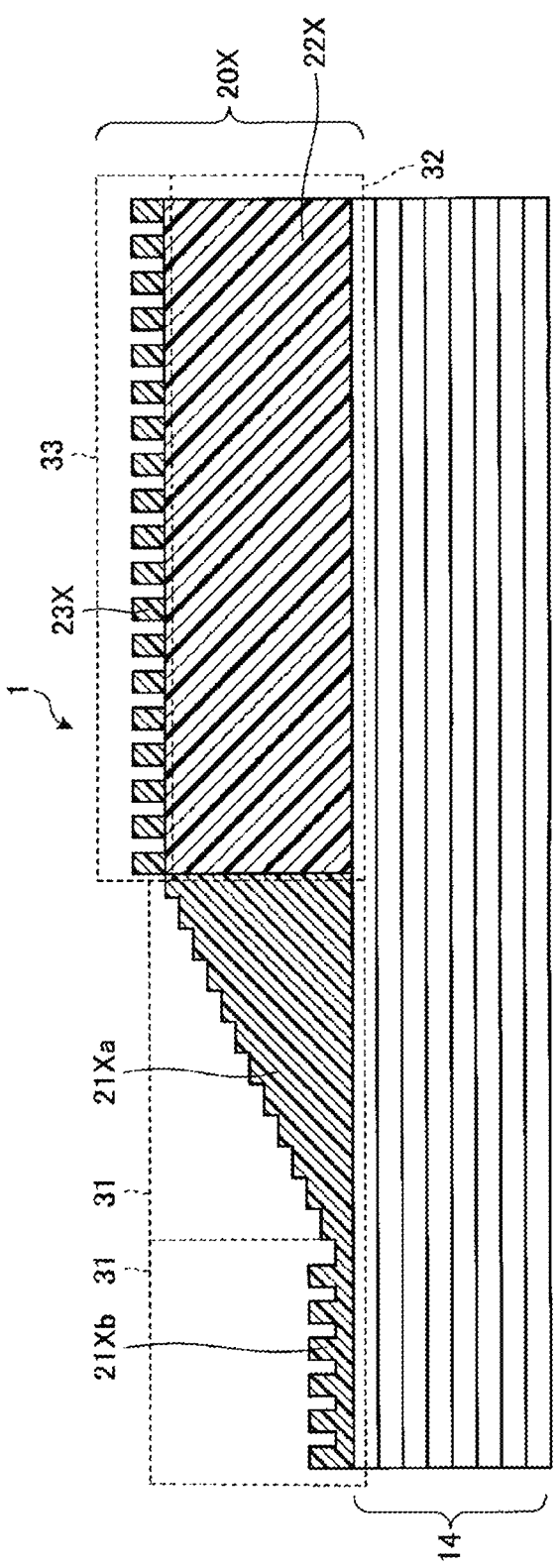

DISPENSING (FIRST TIME) + CONTACT + UV LIGHT EMISSION (FIRST TIME)

SEPARATION + VUV LIGHT EMISSION

DISPENSING (SECOND TIME)

UV LIGHT EMISSION (SECOND TIME)

DISPENSING (FIRST TIME) + CONTACT + UV LIGHT EMISSION (FIRST TIME)

SEPARATION

DISPENSING (SECOND TIME)

VUV LIGHT EMISSION + UV LIGHT EMISSION (SECOND TIME)

DISPENSING (FIRST TIME) + CONTACT + UV LIGHT EMISSION (FIRST TIME)

SEPARATION + VUV LIGHT EMISSION

DISPENSING (SECOND TIME)

UV LIGHT EMISSION (SECOND TIME)

DISPENSING (FIRST TIME) + CONTACT + UV LIGHT EMISSION (FIRST TIME)

SEPARATION

DISPENSING (SECOND TIME) + VUV LIGHT EMISSION

UV LIGHT EMISSION (SECOND TIME)

DISPENSING (FIRST TIME)

UV LIGHT EMISSION (FIRST TIME) + VUV LIGHT EMISSION

DISPENSING (SECOND TIME) + CONTACT + UV LIGHT EMISSION (SECOND TIME)

SEPARATION

DISPENSING (FIRST TIME)

UV LIGHT EMISSION (FIRST TIME)

DISPENSING (SECOND TIME) + VUV LIGHT EMISSION + CONTACT + UV LIGHT EMISSION (SECOND TIME)

SEPARATION

DISPENSING (FIRST TIME)

UV LIGHT EMISSION (FIRST TIME)

VUV LIGHT EMISSION

DISPENSING (SECOND TIME) + CONTACT + UV LIGHT EMISSION (SECOND TIME)

SEPARATION

DISPENSING (FIRST TIME)

UV LIGHT EMISSION (FIRST TIME)

DISPENSING(SECOND TIME) + VUV LIGHT EMISSION

CONTACT + UV LIGHT EMISSION (SECOND TIME)

SEPARATION

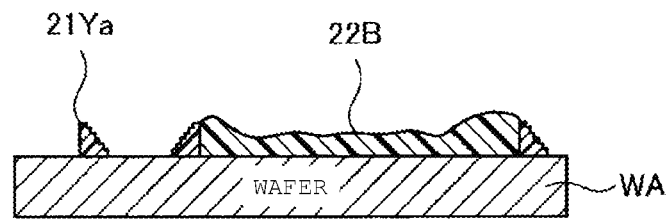
FIG. 22
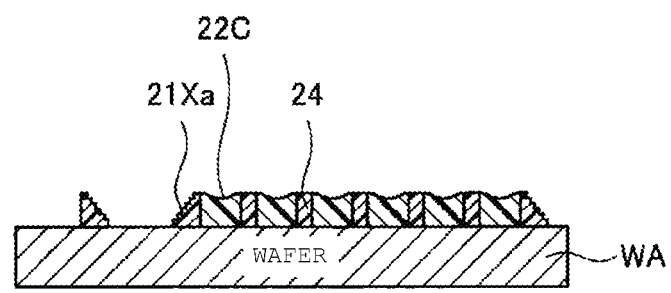
FIG. 23

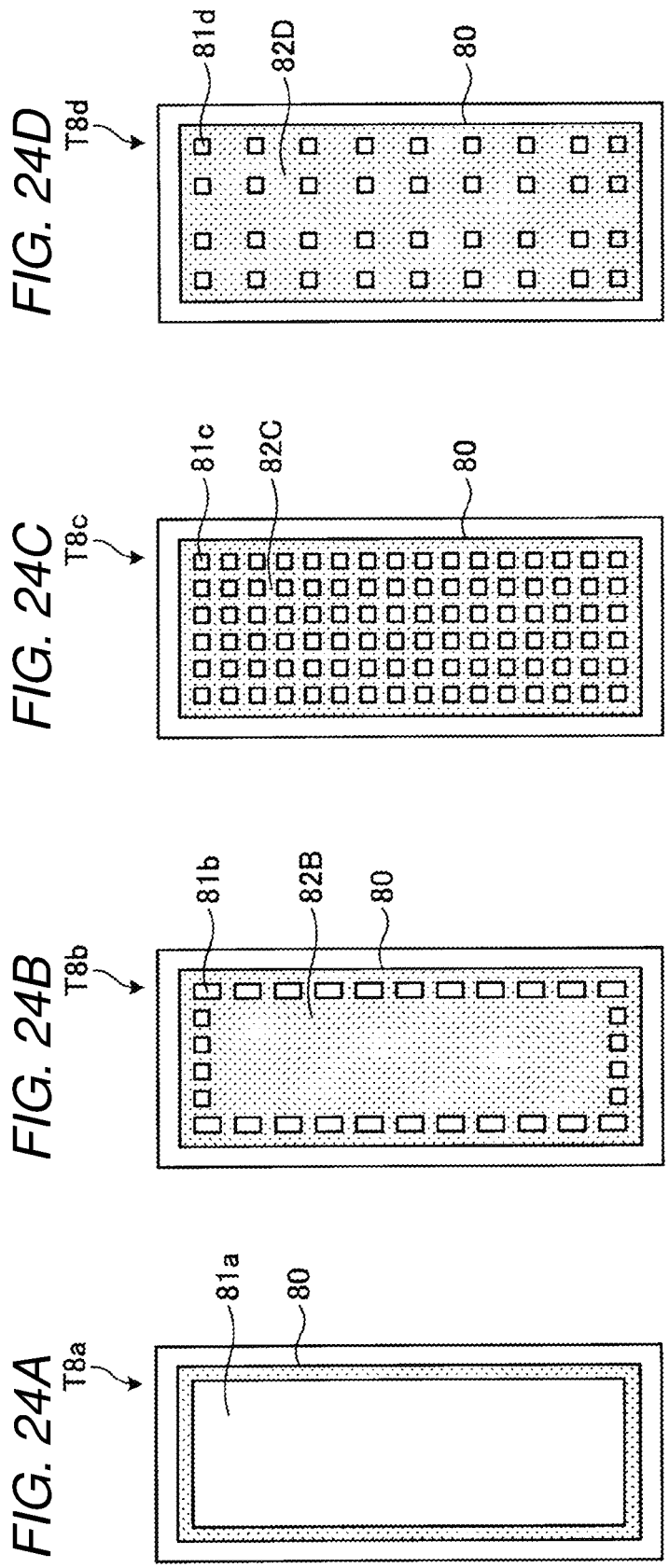

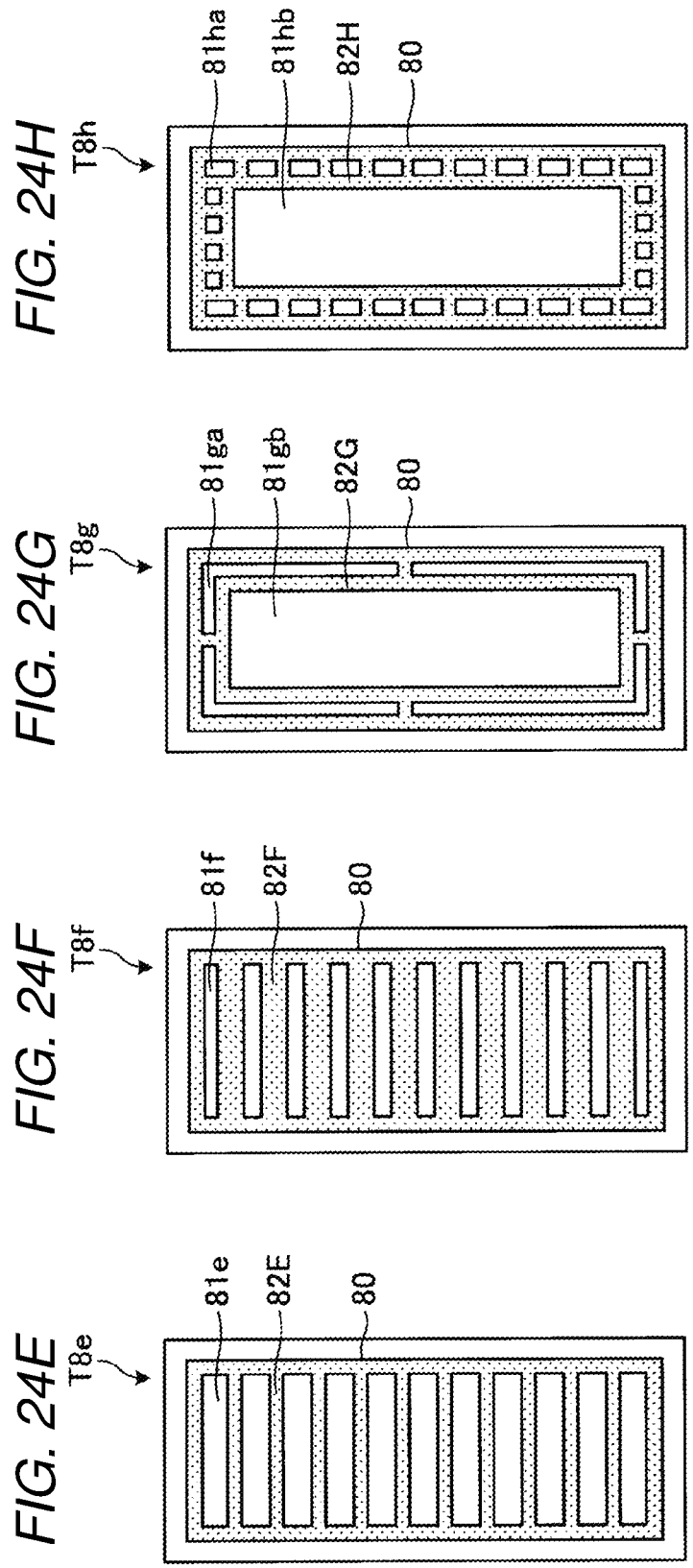

PATTERN FORMING METHOD AND IMPRINT APPARATUS

CROSS-REFERENCE TO RELATED APPLICATIONS

This application is a division of U.S. patent application Ser. No. 15/694,951, filed on Sep. 4, 2017, which is based upon and claims the benefit of priority from Japanese Patent Application No. 2016-229520, filed Nov. 25, 2016, the entire contents of each of which are incorporated herein by reference.

FIELD

Embodiments described herein relate generally to a pattern forming method and an imprint apparatus.

BACKGROUND

Among semiconductor devices, there are devices including three-dimensional memory cell arrays. When such three-dimensional memory cell arrays are manufactured, there are cases where building of integrated structures of a thick film and a fine pattern are required. As one of method for simultaneously forming integrated structures of a thick film pattern and a fine pattern at a low cost, there is imprint lithography.

DESCRIPTION OF THE DRAWINGS

FIGS. 1A and 1B are diagrams that illustrate examples of a resist pattern formed using a pattern forming method according to an embodiment.

FIG. 22 is a diagram that illustrates a guide pattern.

FIG. 23 is a diagram that illustrates an example of other pattern shapes of the guide pattern and the resist pattern.

FIGS. 24A to 24D are diagrams that illustrate a configuration example (1) of the template.

FIGS. 24E to 24H are diagrams that illustrate a configuration example (2) of the template.

DETAILED DESCRIPTION

Figure 2A:
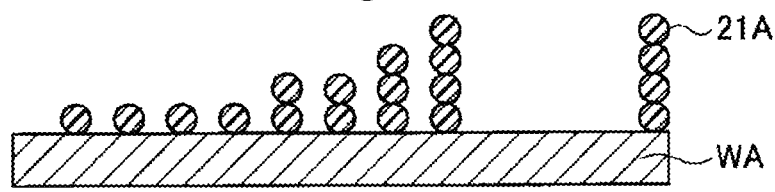
FIGS. 2A to 2I are diagrams that illustrate a first example of a processing sequence of a pattern forming process according to an embodiment.

In general, according to one embodiment, a pattern forming method comprises forming a first resist pattern on a substrate using imprint lithography. And forming a resist onto the substrate at least at positions corresponding to a second resist pattern and then curing the resist to form the second resist pattern on the substrate.

A pattern forming method and an imprint apparatus according to example embodiments will be described with reference to the accompanying drawing. It should be noted that the present disclosure is not limited by the example embodiments.

EXAMPLE EMBODIMENTS

FIGS. 1A and 1B are diagrams that illustrate examples of a resist pattern formed using a pattern forming method according to an embodiment. For example, in a semiconductor device 1 (e.g., a three-dimensional memory array or the like) having a memory cell pattern with a layered structure, generally, a string is formed in a direction perpendicular to a substrate surface. For this reason, wirings are drawn out to the periphery of a memory cell forming area. Then, a contact electrode that becomes part of a wiring is formed on each layer of a stair shape.

Such a semiconductor device 1 includes a thick film memory cell pattern region in which a plurality of memory layers are stacked, a stair-shaped pattern region formed for wiring layers, and a fine pattern region. The semiconductor device 1, for example, is a semiconductor memory, such as a three-dimensional NAND flash memory.

In order to form the semiconductor device 1, a processing target film 14 is formed on a substrate, such as a wafer. This processing target film 14 is the film to be patterned ultimately. Here, the processing target film 14 is a film in which a plurality of insulating layers silicon oxide layer 510/silicon nitride layer 520 are stacked. In other words, on a wafer, silicon oxide layers 510 and silicon nitride layers 520 are alternately stacked to form a stacked body. The silicon nitride layers 520 form layers that will later be replaced by a wiring layer by subsequent processing.

After the processing target film 14 is formed, a stair-shaped pattern region for wiring layers, and a fine pattern region is formed in multiple etching steps using a resist pattern as an etching mask wherein the resist pattern is formed in multiple resist patterning steps.

As illustrated in FIG. 1A, after the processing target film 14 is formed, a resist pattern 20X is formed on the upper layer of the processing target film 14. The resist pattern 20X includes a stair-shaped pattern region and a fine pattern region. In this embodiment, when the resist pattern 20X is formed, multiple resist patterning steps are performed to provide the final resist pattern 20X. Here, a case will be described in which the resist pattern 20X having various thicknesses is formed by performing a resist pattern forming process three times. A single etching process is then performed using resist pattern 20X as an etching mask for forming a stair-shaped pattern and a fine pattern region on the target film 14.

As illustrated in FIG. 1B, in a case where the pattern forming process has been performed three times, the first to third pattern forming processes are sequentially performed. More specifically, resist patterns 21Xa and 21Xb are formed in a first area 31 through a first pattern forming process. Thereafter, a resist pattern 22X is formed in a second area 32 by performing a second pattern forming process. Thereafter, a resist pattern 23X is formed in a third area 33 by performing a third pattern forming process. The resist patterns 21Xa, 21Xb, 22X, and 23X, for example, are each formed in an area having dimensions on the order of a millimeter or less.

The resist pattern 22X is a thick film pattern, also referred to as a base pattern in some contexts, formed in a recess portion corresponding to a cell area. In addition, the resist pattern 23X is a fine pattern formed on the thick film pattern (22X). The resist pattern 23X is formed on top of the resist pattern 22X.

The resist pattern 21Xb is a fine pattern formed in a kerf area. The resist pattern 21Xa is a stair-shaped pattern (that is, has a cross-sectional shape that is a stair-shaped pattern) having a three-dimensional shape. The resist pattern 21X is formed between the kerf area and the cell area. The resist pattern 21Xa has at least one face having the stair-shaped pattern. The bottom surface of the resist patterns 21Xa and 21Xb and the bottom surface of the resist pattern 22X are at an approximately the same height, and the top surface of the resist pattern 21Xa and the top surface of the resist pattern 22X are at an approximately the same height.

The pattern heights of the resist pattern 21Xb and the resist pattern 23X are less than the height of the resist pattern 22X. For example, the resist pattern 22X has a thickness on the order of a millimeter or less, and the resist patterns 23X and 21Xb have thicknesses on the order of a micron or less.

The resist pattern 21Xb is provided in a rectangular annular shape when viewed from the top face. The resist pattern 21Xa is disposed to be in contact with the resist pattern 21Xb on an inner side of the resist pattern 21Xb. Thus, the resist pattern 21Xa is also provided in a rectangular annular shape when viewed from the top face. The resist pattern 22X is formed within an inner area (e.g., a rectangular area surrounded by the resist pattern 21Xa) formed by the resist pattern 21Xb having the annular shape.

An outermost portion of the resist pattern 21Xa is the lowermost stage of the stair shape and has a height that is approximately the same as the resist pattern 21Xb. On the other hand, the innermost portion of the resist pattern 21Xa is the uppermost stage of the stair shape and has a height that is approximately the same as the resist pattern 22X.

In this embodiment, the resist patterns 21Xa, 21Xb, and 23X correspond to a resist filling amount that is smaller than the resist filling amount of the resist pattern 22X. In other words, forming the resist pattern 22X requires a filling amount that is larger than the filling amounts of any of resist patterns 21Xa, 21Xb, and 23X.

For formation of a large pattern (e.g., millimeter or a sub-millimeter feature pattern) an inkjet resist dispense method, an imprint method, or photolithographic method, or the like can be used. For formation of a fine pattern (e.g., micron or a sub-micron pattern feature), a nanoimprint method is used.

In this embodiment, the resist pattern 22X is considered a thick film portion, the resist pattern 21Xb and the resist pattern 23X thin film portions, and the resist pattern 21Xa has a thin film portion and a thick film portion. In other words, the resist pattern 20X is a pattern formed by combining the resist patterns 21Xa, 21Xb, 22X, and 23X. In this embodiment, to form the resist pattern 20X, an area in which a large pattern is formed and an area in which a small pattern is formed are divided from each other, and the large pattern and the small pattern are separately formed in different process steps.

However, when the resist pattern 21Xa is formed before the resist pattern 22X, the resist pattern 21Xa essentially forms a wall pattern having a bathtub shape. Thus, a resist can be dispensed to fill the area surrounded by the resist pattern 21Xa. By curing the resist used to fill the bathtub shape, the resist pattern 22X is formed. Thereafter, the resist pattern 23X is formed on the previously cured resist pattern 22X.

Here, while a case has been described in which first to third pattern forming processes are performed, the first and second pattern forming processes may instead be performed without performing the third pattern forming process at all. In addition, the second and third pattern forming processes may be performed without performing the first pattern forming process.

In addition, in the first pattern forming process, the formation of the resist pattern 21Xb may be omitted. In such a case, the resist pattern 22X is formed after the formation of the resist pattern 21Xa.

Furthermore, the first and third pattern forming processes may be performed after the second pattern forming process. In such a case, any one of the first pattern forming process and the third pattern forming process may be performed first, or the first and third pattern forming processes may be simultaneously performed.

In this embodiment, a three-dimensional shape is formed. More specifically, the resist patterns 21Xa, 21Xb, 22X, and 23X, collectively including large patterns and small patterns, are formed. Such resist patterns 21Xa, 21Xb, 22X, and 23X are used as etching masks for processing target film 14. In description presented below, the processing target film 14 is typically disposed on a wafer substrate. However, the processing target film 14 will not be specifically illustrated in the drawings.

The resist pattern 20X may be formed either using just one type of resist or using a plurality of types of resist. For example, resists 21A, 21Aa, and 23A to be described later, resists 26A and 35 to be described later, a resist to be the resist pattern 21Xb, a resist to be a resist pattern 27X to be described later, and the like may be either of one type or of a plurality of types.

Next, the processing sequence of a pattern forming process according to an embodiment will be described. Here, a case will be described in which an imprint apparatus performs the pattern forming process. FIGS. 2A to 2D are diagrams that illustrate a first example (earlier stages) of a processing sequence of a pattern forming process according to an embodiment. FIGS. 2E to 2I are diagrams that illustrate the first example (latter stages) of the processing sequence of the pattern forming process according to the embodiment. FIGS. 2A to 2I illustrate cross-sectional views of a wafer WA, templates T1 and T2, and the like in the pattern forming process.

Here, the template T1 is a template used for forming the resist patterns 21Xa and 21Xb, and a template pattern in which the resist patterns 21Xa and 21Xb are reversed (i.e., protrusions in the resist pattern are recesses in the template and vice versa) is formed. In addition, the template T2 is a template used for forming the resist pattern 23X, and a template pattern in which the resist pattern 23X is reversed is formed.

In the pattern forming process, the imprint apparatus transfers template patterns (circuit patterns or the like) of the templates T1 and T2 onto a transfer target substrate such as a wafer WA including, for example, a processing target film. In the pattern forming process according to this embodiment, the imprint apparatus performs transfer of the template patterns and formation of the resist pattern 22X. In the templates T1 and T2, template relief patterns that are the inverse of the resist pattern to be transferred to the wafer are formed in a quartz substrate or the like.

As illustrated in FIG. 2A, the imprint apparatus dispenses droplets of a resist 21A on the top face of the wafer WA. The area in which the resist 21A is dispensed is a first area 31 in which resist patterns 21Xa and 21Xb are to be formed.

Figure 2B:
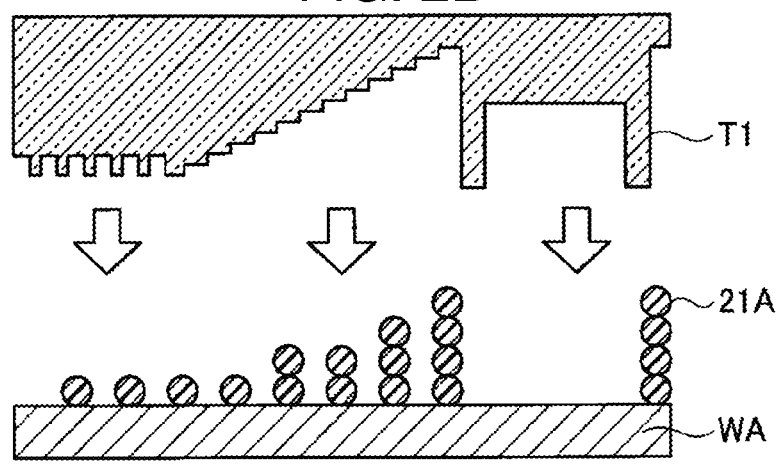
Figure 2C:
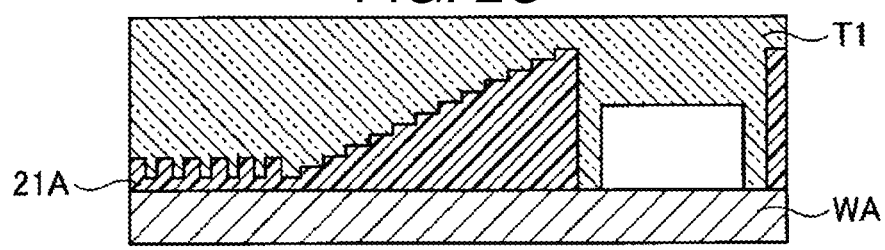

After dispensing the resist 21A, the imprint apparatus, as illustrated in FIG. 2B, moves the template T1 towards the resist 21A and, as illustrated in FIG. 2C, presses the template T1 onto the resist 21A. When the template T1 is brought into contact with the resist 21A, the resist 21A flows into the template pattern based on a capillary phenomenon.

Figure 2D:
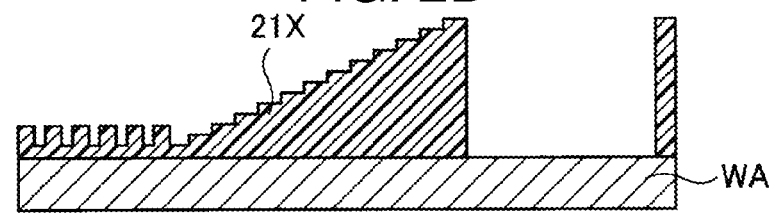

After permitting the filling the template pattern with the resist 21A for some time period, the imprint apparatus irradiates ultraviolet light onto the resist 21A. Accordingly, the resist 21A is cured. Then, as illustrated in FIG. 2D, the imprint apparatus separates the template T1 from the resist pattern 21X (resist patterns 21Xa and 21Xb) formed by curing the resist 21A. Accordingly, the resist pattern 21X, which is the inverse of the template pattern, is formed on the wafer WA. The imprint apparatus may cause the resist 21A to cure through a process using other than the UV light.

Figure 2E:
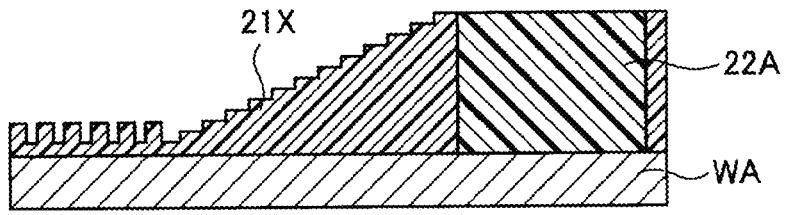

After forming the resist pattern 21X, the imprint apparatus, as illustrated in FIG. 2E, dispenses a resist 22A onto the top face of the wafer WA in a particular area. The area in which the resist 22A is dispensed is a second area 32 in which the resist pattern 22X is to be formed. In this embodiment, the resist pattern 21X is formed such that the second area 32 is surrounded by the resist pattern 21X. Accordingly, the imprint apparatus fills the inner area of the resist pattern 21X with the resist 22A. In other words, the imprint apparatus dispenses the resist 22A into the area surrounded by the resist pattern 21X using the resist pattern 21X as a guide. Thereafter, the imprint apparatus emits UV light onto the resist 22A, whereby the resist 22A is cured.

Figure 2F:
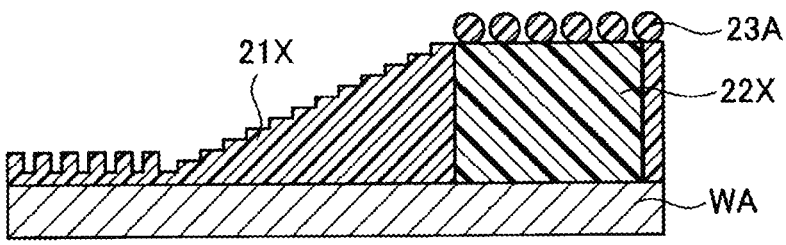

Then, as illustrated in FIG. 2F, the imprint apparatus dispenses a resist 23A onto the resist pattern 22X formed by curing the resist 22A. An area in which the resist 23A is dispensed is a third area 33 in which the resist pattern 23X is to be formed. In other words, the area in which the resist 23A is dispensed is on an area in which the resist pattern 22X is formed.

Figure 2G:
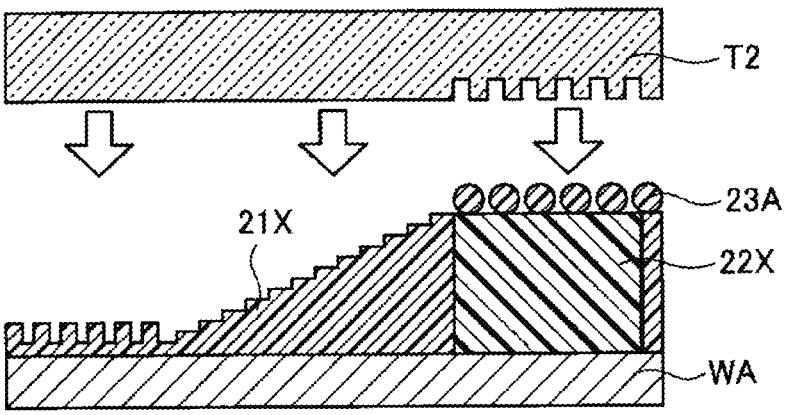
Figure 2H:
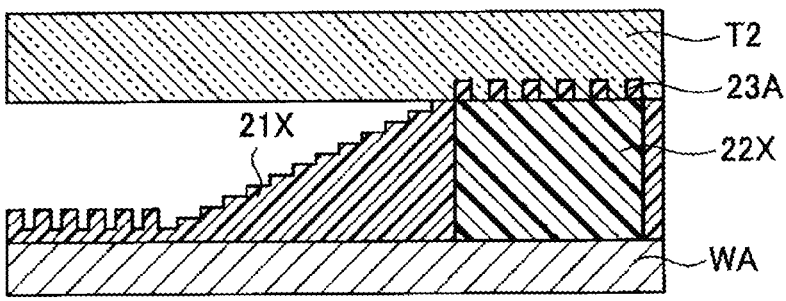

After dispensing the resist 23A, the imprint apparatus, as illustrated in FIG. 2G, moves the template T2 to the resist 23A and, as illustrated in FIG. 2H, presses the template T2 to the resist 23A. In this way, when the template pattern formed in the template T2 is brought into contact with the resist 23A, the resist 23A flows into the template pattern based on a capillary phenomenon.

Figure 2I:
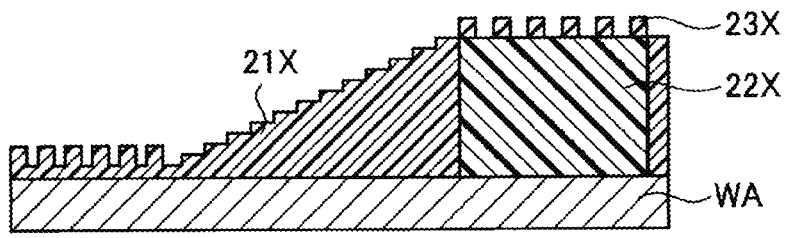
Figure 3A:
FIGS. 3A to 3E are diagrams that illustrate a processing sequence of a pattern forming process of a bathtub type.
Figure 3B:
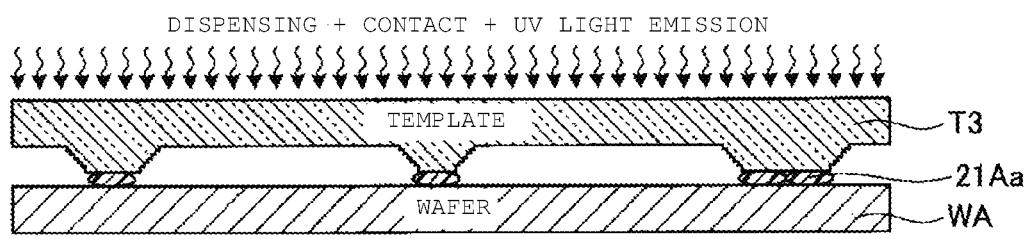
Figure 3C:
Figure 3D:
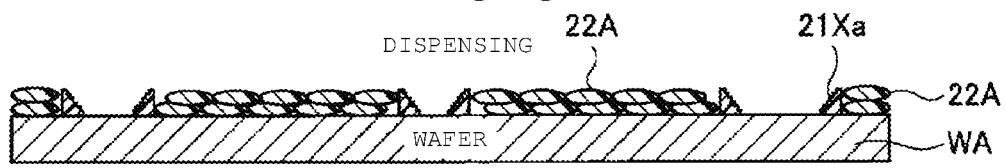
Figure 3E:
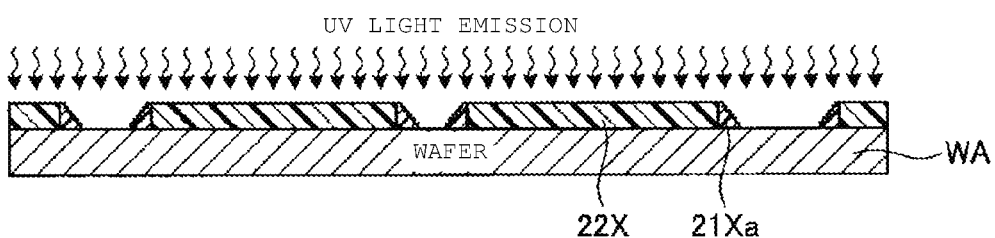

After filling the template pattern with the resist 23A only for a time set in advance, the imprint apparatus shines UV light onto the resist 23A. Accordingly, the resist 23A is cured. Then, the imprint apparatus, as illustrated in FIG. 2I, separates the template T2 from the resist pattern 23X formed by curing the resist 23A. In this way, the resist pattern 23X acquired by reversing the template pattern is formed on the wafer WA.

In addition, the imprint apparatus may cause the resist 23A to cure through a process other than the UV light emitting process. In FIGS. 1A to 2I, while a case is illustrated in which the resist pattern 21Xa having a stair shape has 12 stages, the resist pattern 21Xa may have 11 stages or less or 13 stages or more. In drawings presented below, for allowing the drawings to be easily viewed, a case where the resist pattern 21Xa of the stair shape has six stages will be illustrated.

Next, the detailed processing sequence of a pattern forming process according to an embodiment will be described. Hereinafter, a pattern forming process of the bathtub type will be described, and then, a pattern forming process of the base type will be described.

Pattern Forming Process of Bathtub Type

FIGS. 3A to 3E are diagrams that illustrate the processing sequence of a pattern forming process of a bathtub type. FIGS. 3A to 3E and FIGS. 4A to 8B to be described below illustrate cross-sectional views of a wafer WA, a template T3, and the like in the pattern forming process. Here, the template T3 is a template used for forming the resist pattern 21Xa.

In the pattern forming process of the bathtub type, an imprint apparatus dispenses a resist 21Aa onto an area in which a resist pattern 21Xa is formed on the wafer WA. Thereafter, the imprint apparatus moves a template T3 to the resist 21Aa and brings the template T3 into contact with the resist 21Aa. Accordingly, a template pattern formed in the template T3 is brought into contact with the resist 21Aa, and the resist 21Aa flows into an area corresponding to the shape of the template pattern. Here, the resist 21Aa flows into a position at which the resist 21Aa is in a bathtub shape (rectangular annular shape) that is a wall pattern. Thereafter, the imprint apparatus emits UV light from above the wafer WA. In this way, the imprint apparatus performs resist dispensing, contacting with the template T3, and UV light emission. Accordingly, the resist 21Aa is cured (refer to FIGS. 3A and 3B).

In addition, the resist 21A illustrated in FIGS. 2A to 3E and the resist 21Aa illustrated in FIGS. 3A to 7D may be dropped onto the wafer WA, or the wafer may be coated with the resists described above using a spin-coating device. Furthermore, a resist 26A illustrated in FIGS. 15A and 15B to be described later, a resist 35 illustrated in FIGS. 25A to 25C to be described later, and a resist 21Ya illustrated in FIG. 22 to be described later may be dropped onto the wafer WA, or the wafer may be coated with the resists described above using a spin-coating device. In addition, a resist to be the resist pattern 21Xb illustrated in FIGS. 1A and 1B and a resist to be a resist pattern 27X illustrated in FIGS. 16A to 16C to be described later may be dropped onto the wafer WA, or the wafer may be coated with the resists described above using a spin-coating device. In this way, in a case where a resist is supplied to a wafer WA for imprinting, the resist may be dropped onto the wafer WA, or the wafer may be coated with the resist using a spin-coating device.

In this way, the resist 21Aa is cured and becomes a resist pattern 21Xa that is a bathtub pattern having a rectangular annular shape. The imprint apparatus separates the template T3 from the resist pattern 21Xa formed by curing the resist 21Aa. Accordingly, the resist pattern 21Xa having a stair shape is formed on the wafer WA. In addition, the imprint apparatus may form a fine pattern of the resist pattern 21Xb or the like together with the resist pattern 21Xa (refer to FIG. 3C).

After forming the resist pattern 21Xa, the imprint apparatus dispenses a resist 22A into an annular area surrounded by the resist pattern 21Xa. Then, the imprint apparatus emits UV light from above the wafer WA. In this way, the imprint apparatus performs resist dispensing and UV light emission. Accordingly, the resist 22A is cured to be a resist pattern 22X (refer to FIGS. 3D and 3E).

Next, the specific processing sequence of the pattern forming process of the bathtub type will be described. FIGS. 4A to 4D are diagrams that illustrate a first example of the processing sequence of the pattern forming process of the bathtub-type. Among processes illustrated in FIGS. 4A to 4D, description of processes similar to those illustrated in FIGS. 3A to 3E may not be presented. In a method illustrated in FIGS. 4A to 4D, after VUV light is irradiated onto the resist pattern 21Xa, resist dispensing of the second time is performed. In addition, an imprint apparatus emits UV light and VUV light onto the wafer WA using the same light source.

Figure 4A:
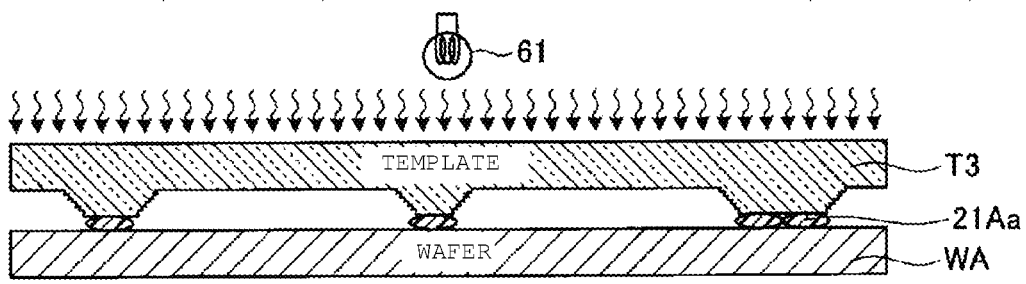
FIGS. 4A to 4D are diagrams that illustrate a first example of the processing sequence of the pattern forming process of the bathtub type.
Figure 4B:
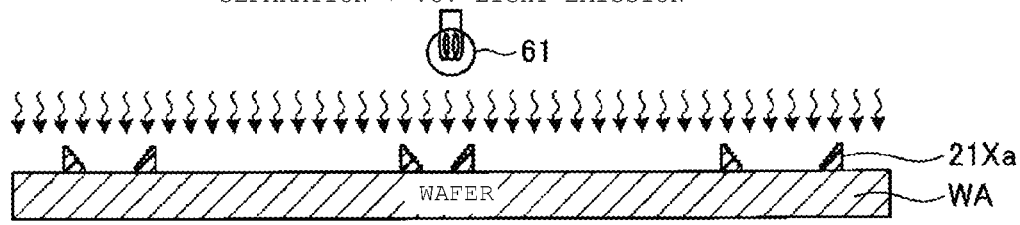
Figure 4C:
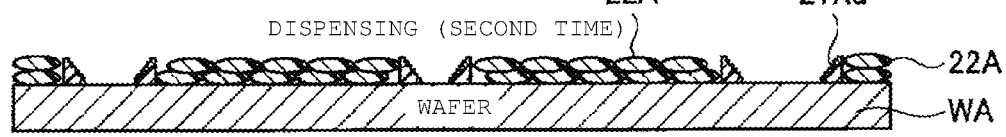
Figure 4D:
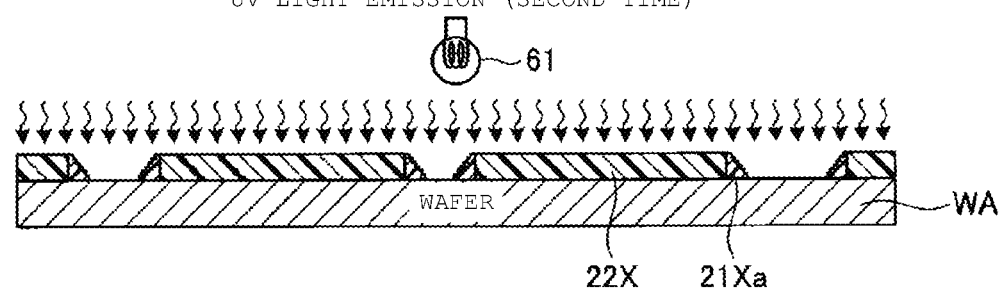

In the example of the first processing sequence of the pattern forming process of the bathtub type, the imprint apparatus performs dispensing (first time) of a resist 21Aa, bringing a template T3 into contact with a resist 21Aa, and UV light emission (first time) using a first light source (light source 61) for the wafer WA (refer to FIG. 4A).

Thereafter, the imprint apparatus separates the template T3 from a resist pattern 21Xa acquired by curing the resist 21Aa. Then, the imprint apparatus emits vacuum ultra-violet (VUV) light from above the wafer WA using the light source 61 that is the first light source. At this time, the imprint apparatus generates VUV light by filtering the light source 61 and irradiates the generated VUV light onto the wafer WA (refer to FIG. 4B).

After emitting the VUV light onto the resist pattern 21Xa, the imprint apparatus dispenses (second time) the resist 22A into an area surrounded by the resist pattern 21Xa. Thereafter, the imprint apparatus emits (second time) UV light from above the wafer WA using the light source 61. Accordingly, the resist 22A is cured to be a resist pattern 22X (refer to FIGS. 4C and 4D).

In this way, in the method described with reference to FIGS. 4A to 4D, the imprint apparatus emits the VUV light onto the resist pattern 21Xa, and accordingly, the adhesiveness between the resist pattern 21Xa and the resist pattern 22X can be improved. Here, the UV light emission, for example is performed in an oxygen-absent environment, and the VUV light emission, for example, is performed in an oxygen-present environment.

FIGS. 5A to 5D are diagrams that illustrate a second example of the processing sequence of the pattern forming process of the bathtub type. Among processes illustrated in FIGS. 5A to 5D, description of processes similar to those illustrated in FIGS. 3A to 4D may not be presented. In a method illustrated in FIGS. 5A to 5D, after resist dispensing of the second time is performed, VUV light is emitted onto a resist pattern 21Xa. In addition, the imprint apparatus emits UV light and VUV light onto the wafer WA using a same light source 61.

Figure 5A:
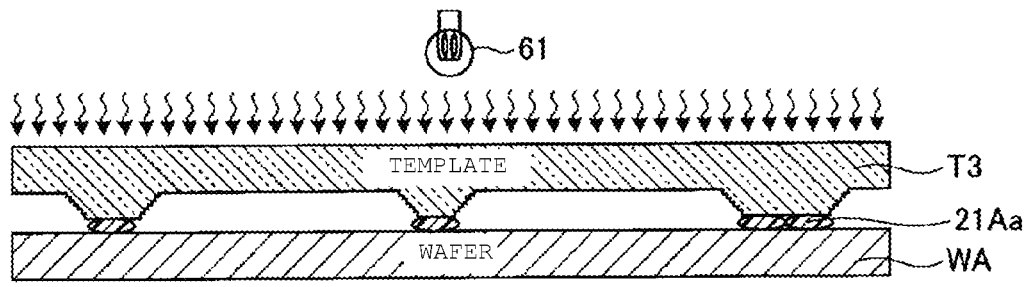
FIGS. 5A to 5D are diagrams that illustrate a second example of the processing sequence of the pattern forming process of the bathtub type.

In the second example of the processing sequence of the pattern forming process of the bathtub type, the imprint apparatus performs dispensing (first time) of a resist 21Aa, bringing a template T3 into contact with the resist 21Aa, and UV light emission (first time) using a light source 61 that is a first light source (refer to FIG. 5A).

Figure 5B:
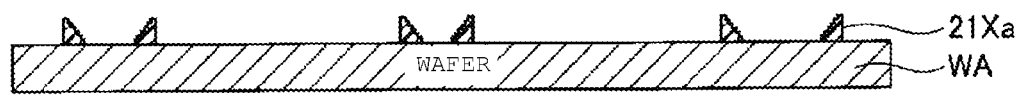
Figure 5C:
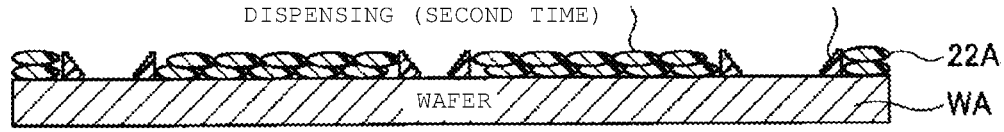
Figure 5D:
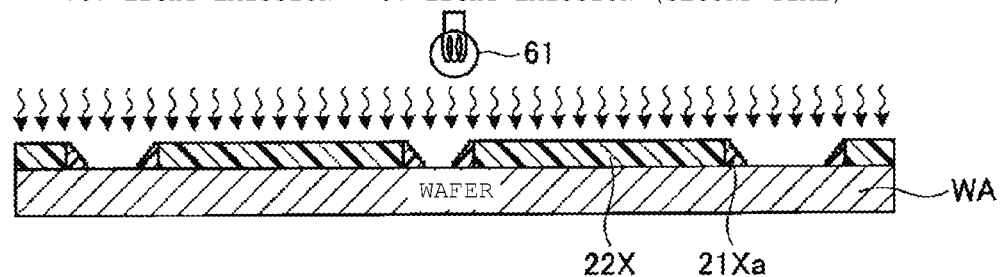

Thereafter, the imprint apparatus separates the template T3 from a resist pattern 21Xa acquired by curing the resist 21Aa (refer to FIG. 5B).

Then, the imprint apparatus dispenses (second time) a resist 22A into an area surrounded by the resist pattern 21Xa. Thereafter, the imprint apparatus emits VUV light from above the wafer WA using the light source 61. At this time, the imprint apparatus generates VUV light by filtering the light source 61 and shines the generated VUV light onto the wafer WA. After emitting the VUV light, the imprint apparatus emits (second time) UV light from above the wafer WA using the light source 61. Accordingly, the resist 22A is cured to be a resist pattern 22X (refer to FIGS. 5C and 5D).

In this way, in the method described with reference to FIGS. 5A to 5D, the imprint apparatus shines the VUV light onto the resist pattern 21Xa and the resist 22A, and accordingly, the adhesiveness between the resist pattern 21Xa and the resist pattern 22X can be improved.

FIGS. 6A to 6D are diagrams that illustrate a third example of the processing sequence of the pattern forming process of the bathtub type. Among processes illustrated in FIGS. 6A to 6D, description of processes similar to those illustrated in FIGS. 3A to 5D may not be presented. In a method illustrated in FIGS. 6A to 6D, after VUV light is emitted onto a resist pattern 21Xa, resist dispensing of the second time is performed. The imprint apparatus emits UV light and VUV light from different light sources.

Figure 6A:
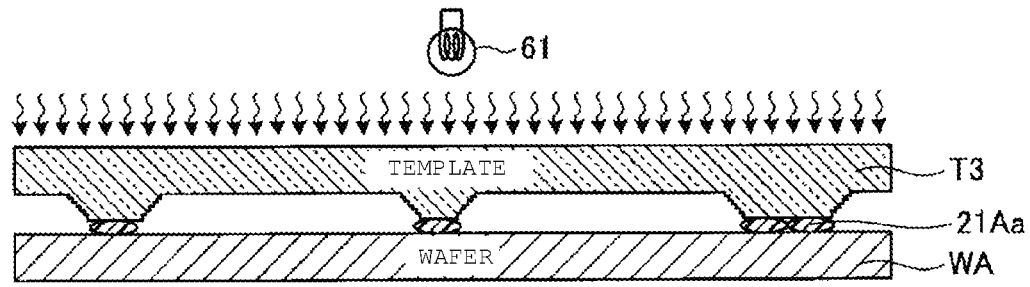
FIGS. 6A to 6D are diagrams that illustrate a third example of the processing sequence of the pattern forming process of the bathtub type.
Figure 6B:
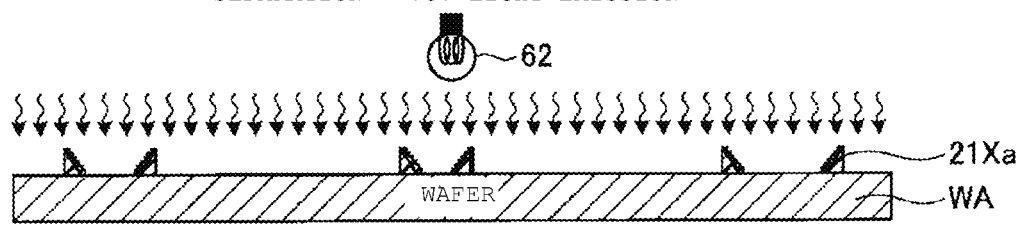
Figure 6C:
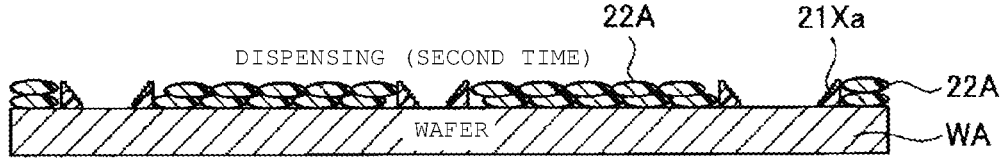
Figure 6D:
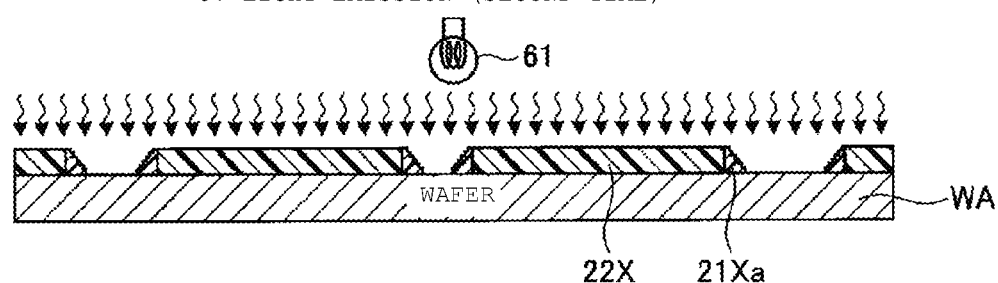

In the third example of the processing sequence of the pattern forming process of the bathtub type, the imprint apparatus performs dispensing (first time) of a resist 21Aa, bringing a template T3 into contact with a resist 21Aa, and UV light emission (first time) using a light source 61 that is a first light source for the wafer WA (refer to FIG. 6A).

Thereafter, the imprint apparatus separates the template T3 from a resist pattern 21Xa acquired by curing the resist 21Aa. Then, the imprint apparatus emits VUV light from above the wafer WA using a light source 62 that is a second light source. At this time, the imprint apparatus emits VUV light from the light source 62, which is different from the light source 61, separately configured and emits the VUV light onto the wafer WA (refer to FIG. 6B).

The imprint apparatus dispenses (second time) a resist 22A into an area surrounded by the resist pattern 21Xa and emits (second time) UV light from above the wafer WA using the light source 61. Accordingly, the resist 22A is cured and becomes a resist pattern 22X (refer to FIGS. 6C and 6D).

In this way, in the method described with reference to FIGS. 6A to 6D, the imprint apparatus emits the VUV light onto the resist pattern 21Xa, and accordingly, the adhesiveness between the resist pattern 21Xa and the resist pattern 22X can be improved.

FIGS. 7A to 7D are diagrams that illustrate a fourth example of the processing sequence of the pattern forming process of the bathtub type. Among processes illustrated in FIGS. 7A to 7D, description of processes similar to those illustrated in FIGS. 3A to 6D may not be presented. In a method illustrated in FIGS. 7A to 7D, after resist dispensing of the second time is performed, VUV light is irradiated onto a resist pattern 21Xa. In addition, the imprint apparatus emits UV light and VUV light from different light sources.

Figure 7A:
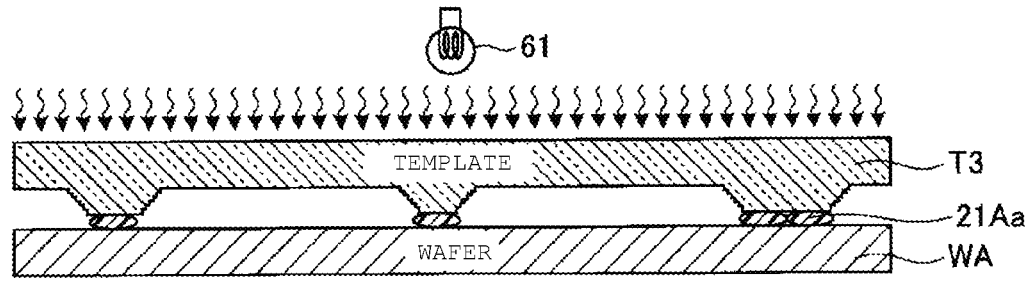
FIGS. 7A to 7D are diagrams that illustrate a fourth example of the processing sequence of the pattern forming process of the bathtub type.

In the fourth example of the processing sequence of the pattern forming process of the bathtub type, the imprint apparatus performs dispensing (first time) of a resist 21Aa, bringing a template T3 into contact with the resist 21Aa, and UV light emission (first time) using the light source 61 that is the first light source for the wafer WA (refer to FIG. 7A).

Figure 7B:
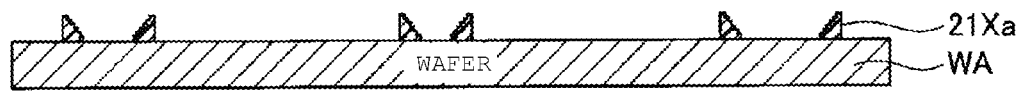
Figure 7C:
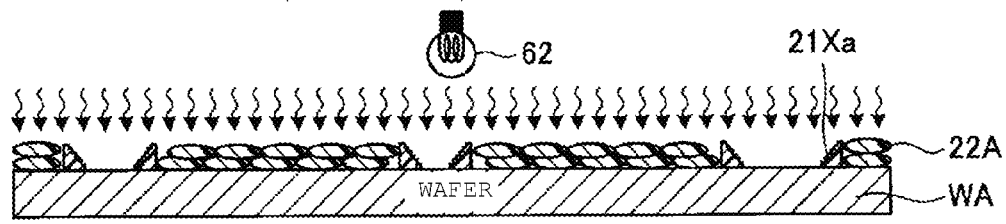
Figure 7D:
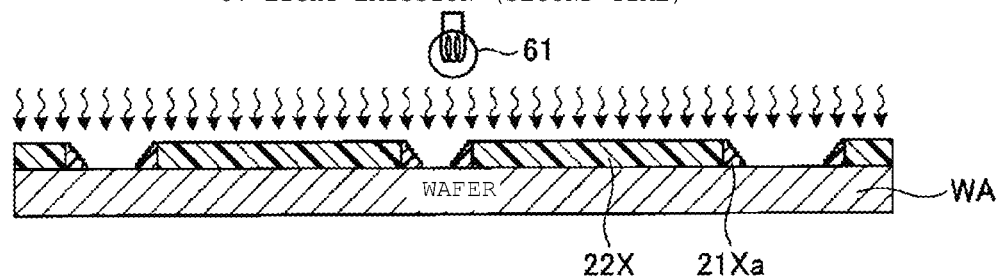

Thereafter, the imprint apparatus separates the template T3 from a resist pattern 21Xa acquired by curing the resist 21Aa (refer to FIG. 7B).

Then, the imprint apparatus dispenses (second time) a resist 22A into an area surrounded by the resist pattern 21Xa. Thereafter, the imprint apparatus emits VUV light from above the wafer WA using a light source 62 that is the second light source. At this time, the imprint apparatus outputs the VUV light from the light source 62, which is different from the light source 61, separately configured and emits the VUV light onto the wafer WA. After emitting the VUV light, the imprint apparatus emits (second time) UV light from above the wafer WA using the light source 61 that is the first light source. Accordingly, the resist 22A is cured to be a resist pattern 22X (refer to FIGS. 7C and 7D).

In this way, in the method described with reference to FIGS. 7A to 7D, the imprint apparatus emits the VUV light onto the resist pattern 21Xa, and accordingly, the adhesiveness between the resist pattern 21Xa and the resist pattern 22X can be improved.

Figure 8A:
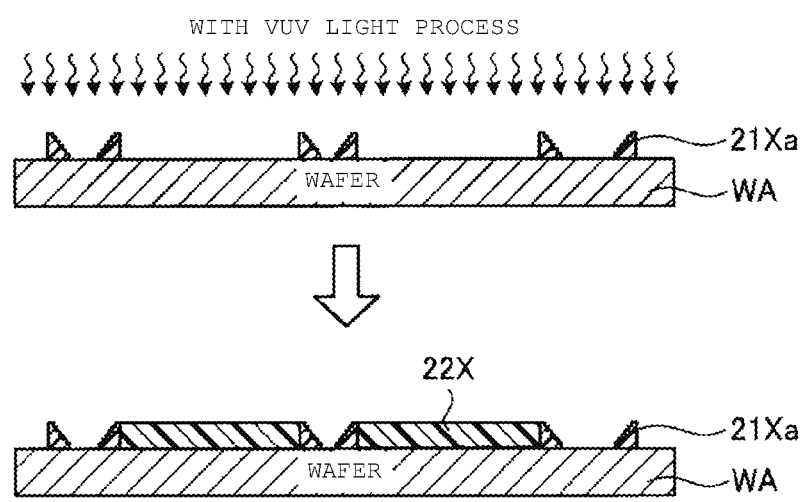
FIGS. 8A and 8B are diagrams that illustrate adhesiveness between resists in different processes.
Figure 8B:
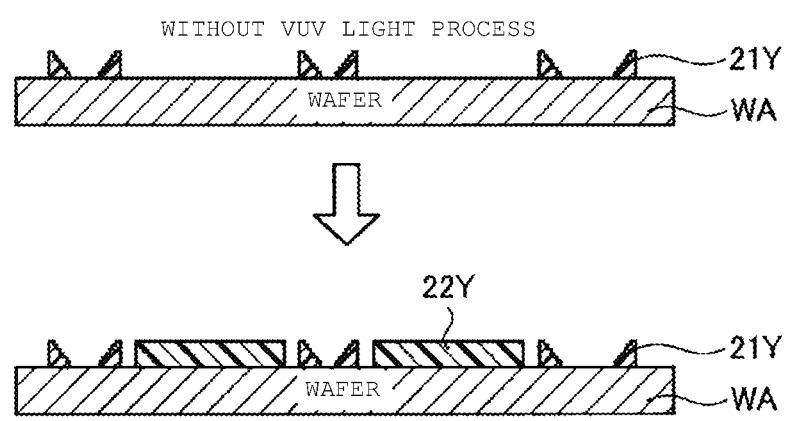

Here, the improvement of the adhesiveness between the resist pattern 21Xa and the resist pattern 22X according to the emission of the VUV light onto the resist pattern 21Xa will be described. FIGS. 8A and 8B are diagrams that illustrate adhesiveness between resists. FIG. 8A illustrates a case where VUV light is emitted (with a VUV light process), and FIG. 8B illustrates a case (without a VUV light process) in which VUV light is not emitted.

In this embodiment, after forming the resist pattern 21Xa, the imprint apparatus shines VUV light onto the resist pattern 21Xa. Accordingly, the surface characteristics of the resist pattern 21Xa change (refer to FIG. 8A).

After dispensing the resist 22A into the area surrounded by the resist pattern 21Xa, the imprint apparatus shines UV light onto the resist 22A. Accordingly, the resist 22A is cured to be a resist pattern 22X.

In this embodiment, as a result of the change in the surface characteristics of the resist pattern 21Xa according to the emission of the VUV light, the adhesiveness between the resist pattern 21Xa and the resist pattern 22X is improved. Accordingly, the occurrence of a contact failure (air gap) between the resist pattern 21Xa and the resist pattern 22X can be prevented. In other words, bubbles can be prevented from being trapped inside a recess portion.

In a case where a resist-insufficient portion is generated, when etching is performed, an etching defect may be caused in a ground substrate. According to this embodiment, the generation of a resist-insufficient portion can be prevented. Accordingly, the occurrence of a processing defect at the time of etching processing can be prevented.

In addition, the resist pattern 21Xa may change the surface characteristics using a method other than the emission of VUV light such that the adhesiveness with the resist pattern 22X is improved. For example, by coating the resist pattern 21Xa with an adhesive agent, the surface characteristics may be changed such that the adhesiveness with the resist pattern 22X is improved. In such a case, the imprint apparatus may provide the adhesive agent in the resist pattern 21Xa, or another device may provide the adhesive agent in the resist pattern 21Xa.

On the other hand, in a case where the surface characteristics of the resist pattern 21Y are not changed according to the emission of VUV light or the like, the adhesiveness between the resist pattern 21Y and the resist pattern 22Y deteriorates. As a result, a contact failure between the resist pattern 21Y and the resist pattern 22Y occurs, and an air gap is generated between the resist pattern 21Y and the resist pattern 22Y (refer to FIG. 8B).

Pattern Forming Process of Base type

FIGS. 9A to 9D are diagrams that illustrate the processing sequence of a pattern forming process of a base type. FIGS. 9A to 9D and FIGS. 10A to 13E to be described later, illustrate cross-sectional views of a wafer WA, a template 14, and the like in the pattern forming process. Here, the template T4 is a template used for forming the resist patterns 21Xa, 21Xb, and 23X.

Figure 9A:
FIGS. 9A to 9D are diagrams that illustrate a processing sequence of a pattern forming process of a base type.
Figure 9B:
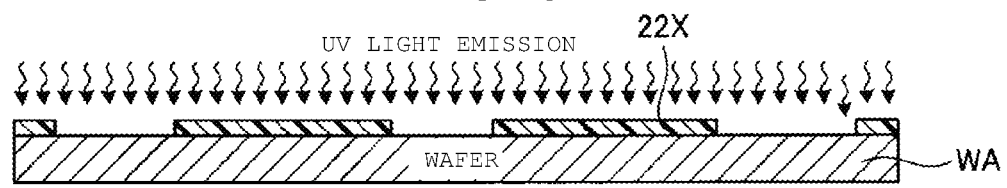
Figure 9C:
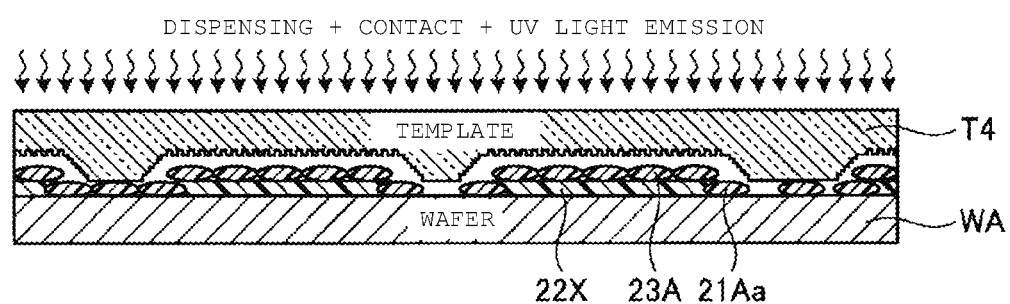
Figure 9D:
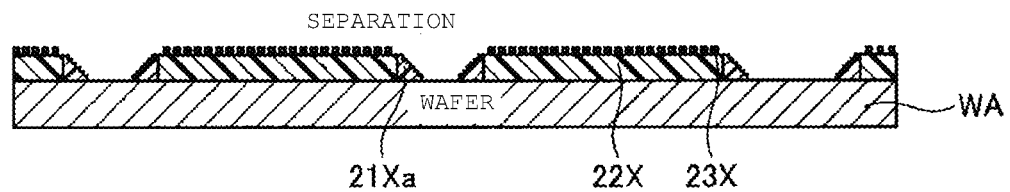

In the pattern forming process of the base type, an imprint apparatus dispenses a resist 22A into an area in which a resist pattern 22X is formed on a wafer WA (refer to FIG. 9A).

Thereafter, the imprint apparatus emits UV light from above the wafer WA. Accordingly, the resist 22A is cured to be a resist pattern 22X. The resist pattern 22X is a pattern having a stand shape and is a pattern serving as a base of a fine pattern and the like (refer to FIG. 9B).

After forming the resist pattern 22X, the imprint apparatus dispenses resists 21Aa and 23A on areas in which resist patterns 21Xa and 23X are formed on the wafer WA. Then, the imprint apparatus moves the template 14 to the resists 21Aa and 23A and brings the template T4 into contact with the resists 21Aa and 23A. Accordingly, template patterns formed in the template T4 is brought into contact with the resists 21Aa and 23A, and the template pattern is filled with the resists 21Aa and 23A. Then, the imprint apparatus emits UV light from above the wafer WA. Accordingly, the resists 21Aa and 23A are cured (refer to FIG. 9C).

In this way, the resist 21Aa is cured to be a resist pattern 21Xa, and the resist 23A is cured to be a resist pattern 23X. In addition, the imprint apparatus may form fine patterns such as a resist pattern 21Xb and the like together with the resist patterns 21Xa and 23X. After the resist patterns 21Xa and 23X are formed, the imprint apparatus separates the template T4 from the resist patterns 21Xa and 23X. Accordingly, the resist pattern 21Xa having a stair shape is formed on the wafer WA, and the resist pattern 23X that is a fine pattern is formed on the resist pattern 22X that is a base pattern. The UV light emission, for example, is performed in an oxygen-absent environment, and the VUV light emission, for example, is performed in an oxygen-present environment (refer to FIG. 9D).

Next, a specific processing sequence of the pattern forming process of the base type will be described. FIGS. 10A to 10D are diagrams that illustrate a first example of the processing sequence of the pattern forming process of the base type. Among processes illustrated in FIGS. 10A to 10D, description of processes similar to those illustrated in FIGS. 9A to 9D may not be presented. In a method illustrated in FIGS. 10A to 10D, after VUV light is emitted onto a resist pattern 22X, resist dispensing of the second time is performed. In addition, an imprint apparatus emits UV light and VUV light onto the wafer WA using the same light source.

Figure 10A:
FIGS. 10A to 10D are diagrams that illustrate a first example of the processing sequence of the pattern forming process of the base type.
Figure 10B:
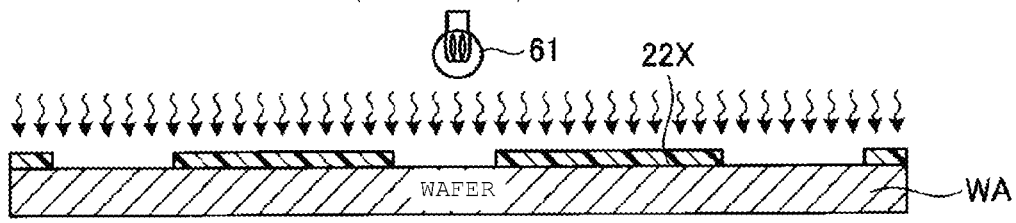
Figure 10C:
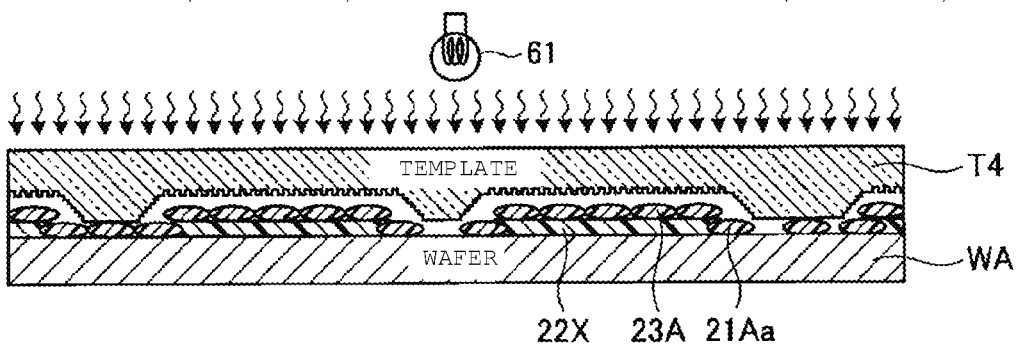
Figure 10D:
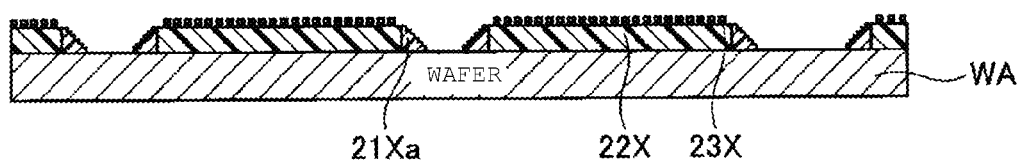

In the first example of the processing sequence of the pattern forming process of the base type, the imprint apparatus performs dispensing (first time) of a resist 22A for the wafer WA (refer to FIG. 10A).

Then, the imprint apparatus emits (first time) UV light from above the wafer WA using a light source 61 that is a first light source. Accordingly, the resist 22A is cured to be a resist pattern 22X. In addition, the imprint apparatus emits VUV light from above the wafer WA using the light source 61 that is the first light source. At this time, the imprint apparatus generates VUV light by filtering the light source 61 and emits the generated VUV light onto the wafer WA (refer to FIG. 10B).

Thereafter, the imprint apparatus dispenses (second time) resists 21Aa and 23A into areas in which the resist patterns 21Xa and 23X are formed on the wafer WA. Then, the imprint apparatus moves the template T4 to the resists 21Aa and 23A and brings the template T4 into contact with the resists 21Aa and 23A. Accordingly, a template pattern formed in the template T4 is brought into contact with the resists 21Aa and 23A, and the template pattern is filled with the resists 21Aa and 23A. Then, the imprint apparatus shines UV light (second time) from above the wafer WA using the light source 61 that is the first light source (refer to FIG. 10C).

Accordingly, the resists 21Aa and 23A are cured to be the resist patterns 21Xa and 23X. Thereafter, the imprint apparatus separates the template T4 from the resist patterns 21Xa and 23X. Accordingly, the resist patterns 21Xa, 22X, and 23X are formed on the wafer WA (refer to FIG. 10D).

In this way, in the method described with reference to FIGS. 10A to 10D, the imprint apparatus shines the VUV light onto the resist pattern 22X, and accordingly, the adhesiveness between the resist pattern 22X and the resist patterns 21Xa and 23X can be improved.

FIGS. 11A to 11D are diagrams that illustrate a second example of the processing sequence of the pattern forming process of the base type. Among processes illustrated in FIGS. 11A to 11D, description of processes similar to those illustrated in FIGS. 9A to 10D may not be presented. In a method illustrated in FIGS. 11A to 11D, after resist dispensing of the second time is performed, VUV light is emitted onto a resist pattern 22X. In addition, the imprint apparatus emits UV light and VUV light onto the wafer WA using a same light source 61.

Figure 11A:
FIGS. 11A to 11D are diagrams that illustrate a second example of the processing sequence of the pattern forming process of the base type.
Figure 11B:
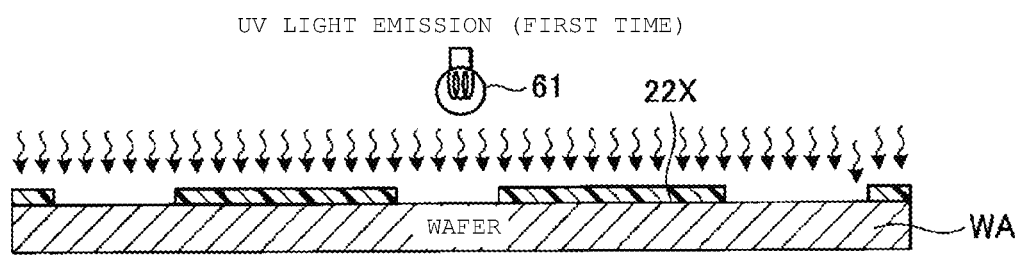
Figure 11C:
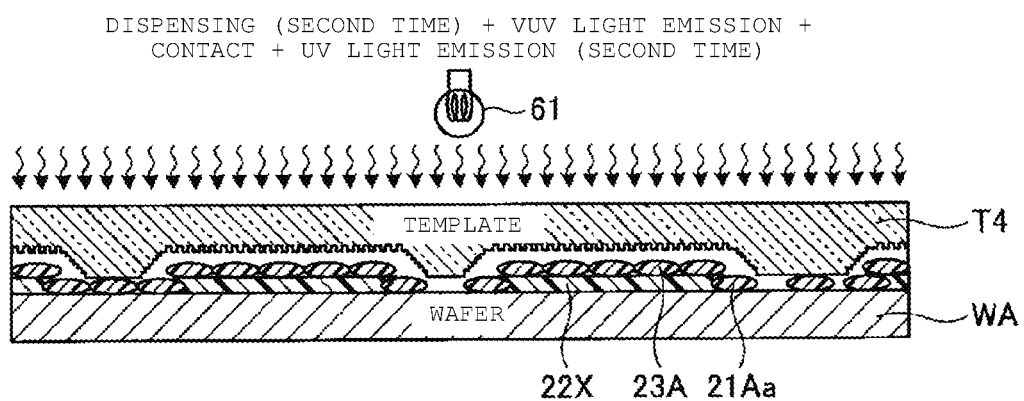
Figure 11D:
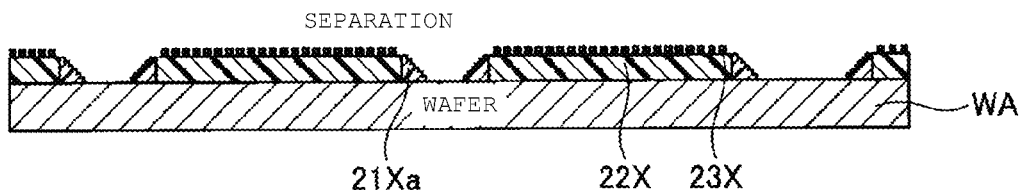

In the second example of the processing sequence of the pattern forming process of the base type, the imprint apparatus performs dispensing (first time) of a resist 22A for the wafer WA (refer to FIG. 11A).

Then, the imprint apparatus emits (first time) UV light from above the wafer using the light source 61 that is the first light source. Accordingly, the resist 22A is cured to be a resist pattern 22X (refer to FIG. 11B).

Thereafter, the imprint apparatus dispenses (second time) resists 21Aa and 23A on areas in which resist patterns 21Xa and 23X are formed on the wafer WA. Then, the imprint apparatus emits VUV light from above the wafer WA using the light source 61 that is the first light source. At this time, the imprint apparatus generates VUV light by filtering the light source 61 and shines the generated VUV light onto the wafer WA. Thereafter, the imprint apparatus moves the template T4 to the resists 21Aa and 23A and brings the template T4 into contact with the resists 21Aa and 23A. Accordingly, a template pattern formed in the template T4 is brought into contact with the resists 21Aa and 23A, and the template pattern is filled with the resists 21Aa and 23A. Then, the imprint apparatus emits (second time) UV light from above the wafer WA using the light source 61 that is the first light source. Accordingly, the resists 21Aa and 23A are cured (refer to FIG. 11C).

Accordingly, the resists 21Aa and 23A are cured to be the resist patterns 21Xa and 23X. Thereafter, the imprint apparatus separates the template 14 from the resist patterns 21Xa and 23X. Accordingly, the resist patterns 21Xa, 22X, and 23X are formed on the wafer WA (refer to FIG. 11D).

In this way, in the method described with reference to FIGS. 11A to 11D, the imprint apparatus emits the VUV light onto the resist pattern 22X, and accordingly, the adhesiveness between the resist pattern 22X and the resist patterns 21Xa and 23X can be improved.

FIGS. 12A to 12E are diagrams that illustrate a third example of the processing sequence of the pattern forming process of the base type. Among processes illustrated in FIGS. 12A to 12E, description of processes similar to those illustrated in FIGS. 9A to 11D may not be presented. In a method illustrated in FIGS. 12A to 12E, after VUV light is irradiated onto a resist pattern 22X, resist dispensing of the second time is performed. The imprint apparatus emits UV light and VUV light from different light sources.

Figure 12A:
FIGS. 12A to 12E are diagrams that illustrate a third example of the processing sequence of the pattern forming process of the base type.
Figure 12B:
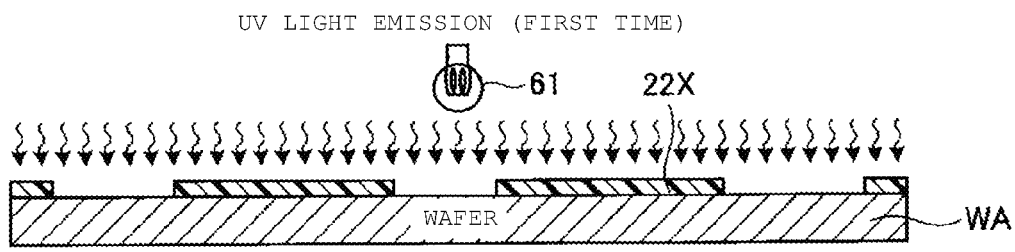
Figure 12C:
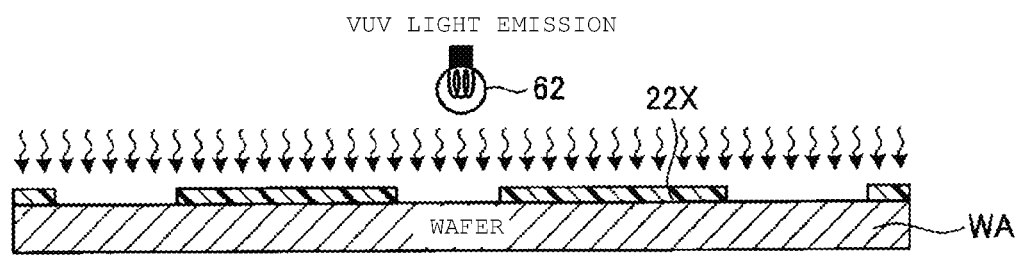
Figure 12D:
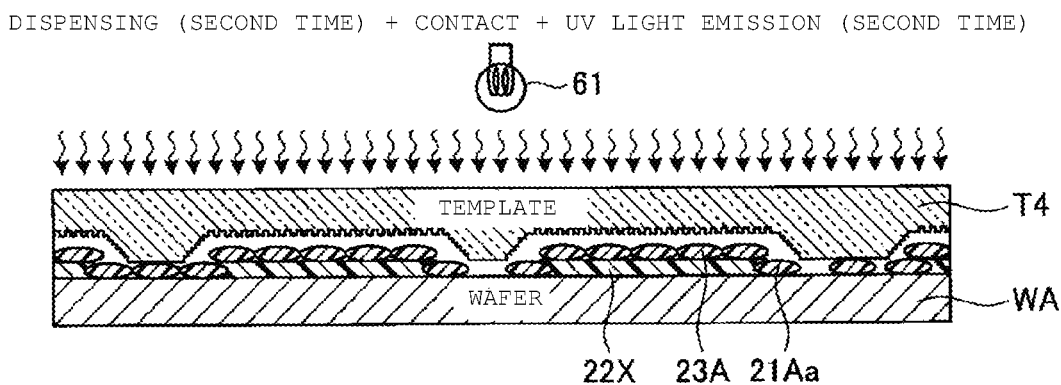
Figure 12E:
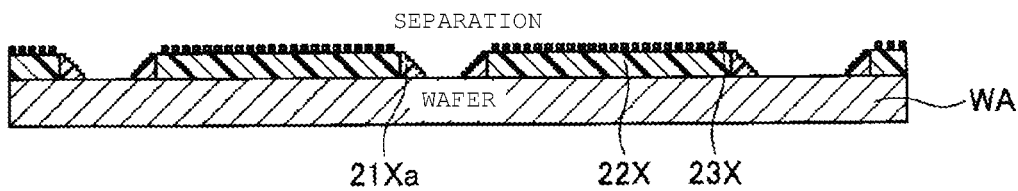

In the third example of the processing sequence of the pattern forming process of the base type, the imprint apparatus performs dispensing (first time) of a resist 22A for a wafer WA (refer to FIG. 12A).

Then, the imprint apparatus emits UV light (first time) from above the wafer WA using a light source 61 that is a first light source. Accordingly, the resist 22A is cured to be a resist pattern 22X (refer to FIG. 12B).

In addition, the imprint apparatus emits VUV light from above the wafer WA using a second light source 62 that is a second light source. At this time, the imprint apparatus emits VUV light from the light source 62, which is different from the light source 61, separately configured and irradiates the VUV light onto the wafer WA (refer to FIG. 12C).

Thereafter, the imprint apparatus dispenses (second time) resists 21Aa and 23A on areas in which resist patterns 21Xa and 23X are formed on the wafer WA. Then, the imprint apparatus moves the template T4 to the resists 21Aa and 23A and brings the template T4 into contact with the resists 21Aa and 23A. Accordingly, a template pattern formed in the template T4 is brought into contact with the resists 21Aa and 23A, and the template pattern is filled with the resists 21Aa and 23A. Then, the imprint apparatus emits (second time) UV light from above the wafer WA using the light source 61 that is the first light source (refer to FIG. 12D).

Accordingly, the resists 21Aa and 23A are cured to be the resist patterns 21Xa and 23X. Thereafter, the imprint apparatus separates the template T4 from the resist patterns 21Xa and 23X. Accordingly, the resist patterns 21Xa, 22X, and 23X are formed on the wafer WA (refer to FIG. 12E).

In this way, in the method described with reference to FIGS. 12A to 12E, the imprint apparatus irradiates the VUV light onto the resist pattern 22X, and accordingly, the adhesiveness between the resist pattern 22X and the resist patterns 21Xa and 23X can be improved.

FIGS. 13A to 13E are diagrams that illustrate a fourth example of the processing sequence of the pattern forming process of the base type. Among processes illustrated in FIGS. 13A to 13E, description of processes similar to those illustrated in FIGS. 9A to 12E may not be presented. In a method illustrated in FIGS. 13A to 13E, after resist dispensing of the second time is performed, VUV light is irradiated onto a resist pattern 22X. In addition, the imprint apparatus emits UV light and VUV light from different light sources.

Figure 13A:
FIGS. 13A to 13E are diagrams that illustrate a fourth example of the processing sequence of the pattern forming process of the base type.
Figure 13B:
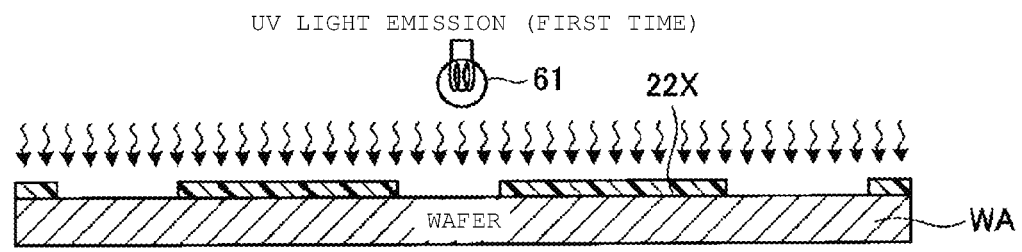
Figure 13C:
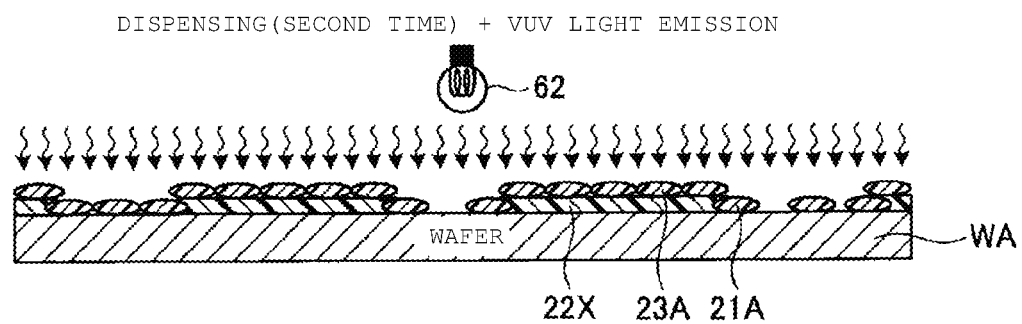
Figure 13D:
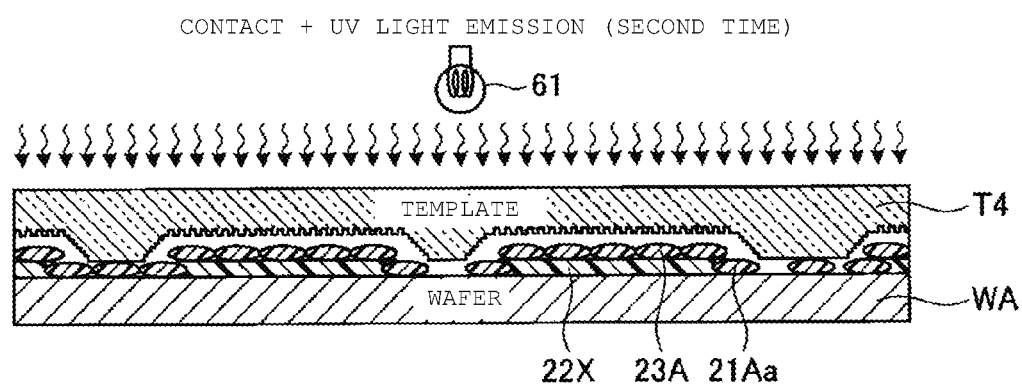
Figure 13E:
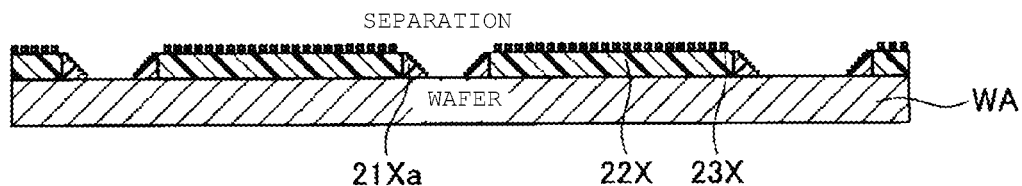

In the fourth example of the processing sequence of the pattern forming process of the base type, the imprint apparatus performs dispensing (first time) of a resist 22A for the wafer WA (refer to FIG. 13A).

Then, the imprint apparatus emits (first time) UV light from above a wafer WA using a light source 61 that is a first light source. Accordingly, the resist 22A is cured to be a resist pattern 22X (refer to FIG. 13B).

Thereafter, the imprint apparatus dispenses (second time) resists 21Aa and 23A on areas in which resist patterns 21Xa and 23X are formed on the wafer WA. Then, the imprint apparatus emits VUV light from above the wafer WA using a light source 62 that is a second light source. At this time, the imprint apparatus emits VUV light from the light source 62, which is different from the light source 61, separately configured and irradiates the VUV light onto the wafer WA (refer to FIG. 13C).

Thereafter, the imprint apparatus moves the template T4 to the resists 21Aa and 23A and brings the template T4 into contact with the resists 21Aa and 23A. Accordingly, a template pattern formed in the template T4 is brought into contact with the resists 21Aa and 23A, and the areas are filled with the resists 21Aa and 23A in the template pattern. Then, the imprint apparatus emits (second time) UV light from above the wafer WA using the light source 61 that is the first light source (refer to FIG. 13D).

Accordingly, the resists 21Aa and 23A are cured to be the resist patterns 21Xa and 23X. Thereafter, the imprint apparatus separates the template T4 from the resist patterns 21Xa and 23X. Accordingly, the resist patterns 21Xa, 22X, and 23X are formed on the wafer WA (refer to FIG. 13E).

In this way, in the method described with reference to FIGS. 13A to 13E, the imprint apparatus shines the VUV light onto the resist pattern 22X, and accordingly, the adhesiveness between the resist pattern 22X and the resist patterns 21Xa and 23X can be improved.

Figure 14:
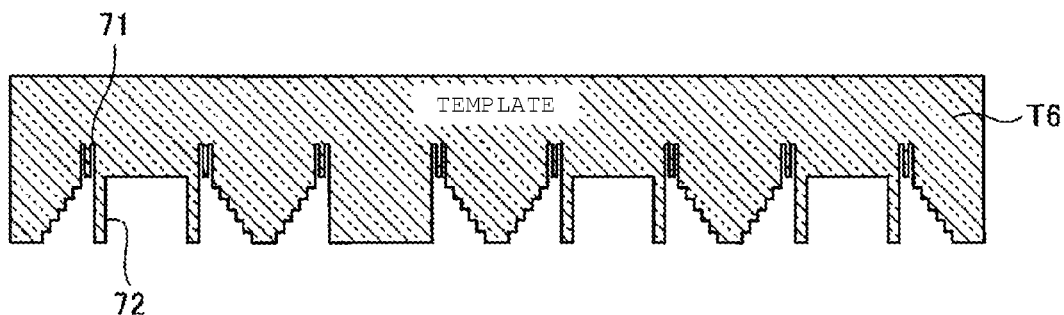
FIG. 14 is a diagram that illustrates an example of a cross-sectional configuration of a template.
Figure 15A:
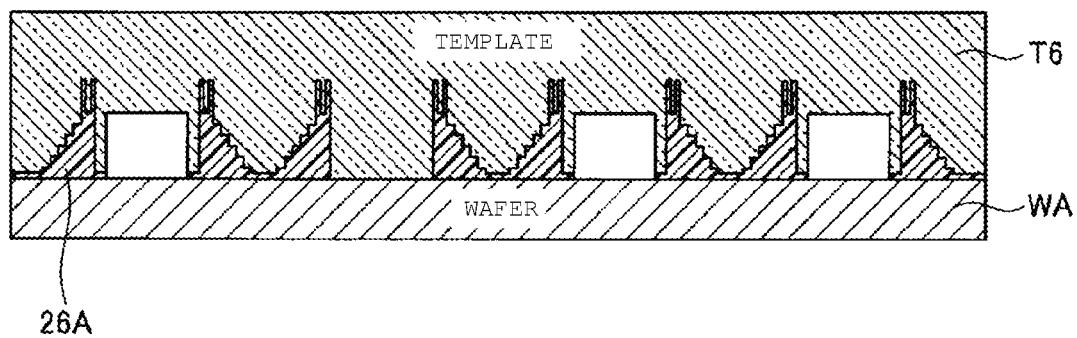
FIGS. 15A and 15B are diagrams that illustrate an example of a sequence of a pattern forming process using the template illustrated in FIG. 14.
Figure 15B:
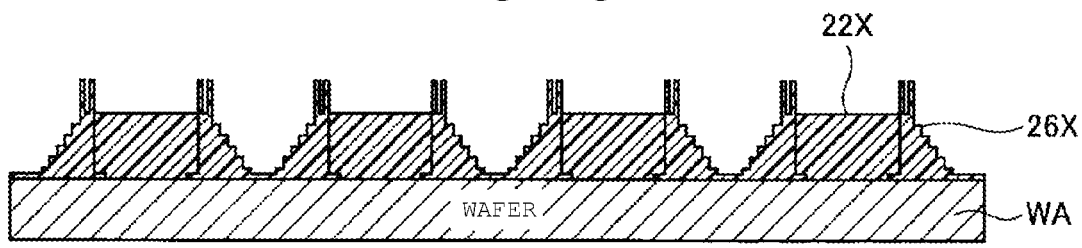

The template may have any shape without being limited to one of shapes of the templates T1 to T4 described above. FIG. is a diagram that illustrates an example of the cross-sectional configuration of the template. FIG. 14 and FIGS. 15A and 15B to be described later illustrate cross-sectional views of a wafer WA, a template T6, and the like in the pattern forming process. Here, the template T6, similar to the templates T1 to T4, is a template used for forming a resist pattern.

The template T6 illustrated in FIG. 14 includes stopper patterns 71 and 72 used for preventing liquid leakage (flowing-out) of a resist in addition to the template patterns included in the templates T1 to T4.

The template patterns included in the templates T1 to T4 are patterns used for forming the resist pattern 21Xa that is a pattern having a stair shape, the resist pattern 22X that is a base pattern, the resist patterns 21Xb and 23X that are fine patterns, and the like.

The stopper patterns 71 and 72 prevent resists filling in the template patterns included in the templates T1 to T4 from flowing out. More specifically, the stopper pattern 71 prevents the resist 22A dispensed into the area to become the resist pattern 22X from flowing out to the resist pattern 21Xa. The stopper pattern 72 prevents the resist 22A dispensed into the area to become the resist pattern 21Xa from flowing out to the area of the resist pattern 22X.

The stopper pattern 71, for example, has a shape in which hollow columnar shapes are bonded. In addition, the stopper pattern 72, for example, has a shape in which patterns of columnar shapes are bonded together. The stopper patterns 71 and 72 are formed to surround near the outer periphery of the area (for example, a rectangular parallelepiped area) to be the resist pattern 22X. The stopper pattern 71 is formed at a top position of the area that becomes the stair shape of the resist pattern 21Xa. The stopper pattern 72 is formed in an outer periphery portion of the area that becomes the resist pattern 22X.

In this way, the stopper pattern 71 has a cross-sectional recess shape in which a top portion of the template pattern having the stair shape is raised. In addition, the stopper pattern 72 has a protrusion cross-sectional shape blocking the template pattern having the stair shape and the template pattern having the base shape. According to such a configuration, a protrusion pattern is formed on the wafer WA in accordance with the stopper pattern 71. In addition, according to such a configuration, a recess pattern is formed on the wafer WA in accordance with the stopper pattern 72.

FIGS. 15A and 15B are diagrams that illustrate an example of the sequence of a pattern forming process using the template illustrated in FIG. 14. Among processes illustrated in FIGS. 15A and 15B, description of processes similar to those illustrated in FIGS. 3A to 3E are not presented.

In the pattern forming process using the template T6, an imprint apparatus dispenses a resist 26A into an area in which a template pattern having a stair shape is formed on a wafer WA. Thereafter, the imprint apparatus moves the template T6 to the resist 26A and brings the template T6 into contact with the resist 21A. Accordingly, the resist 26A flows into an area according to the shape of the template pattern. Here, the resist 26A flows into the template pattern having the stair shape and the stopper pattern 71. In this case, since the stopper pattern 72 is formed in the template T6, the resist 26A disposed inside the area in which the template pattern having the stair shape is formed can be prevented from flowing into the area in which the template pattern having the base-like shape is formed (refer to FIG. 15A).

Thereafter, the imprint apparatus causes the resist 26A to cure by emitting UV light from above the wafer WA. Then, the imprint apparatus separates the template T6 from a resist pattern 26X. Accordingly, the template pattern having a stair shape and the resist pattern 26X corresponding to the stopper pattern 71 are formed on the wafer WA (refer to FIG. 15B).

Then, the imprint apparatus dispenses a resist into an area surrounded by the resist pattern 26X. In addition, the imprint apparatus emits UV light from above the wafer WA to cause the resist disposed inside an area surrounded by the resist pattern 26X to cure, thereby forming a resist pattern 22X.

The base pattern (the resist pattern 22X or the like) requires a larger amount of resist than that used in forming a fine pattern, a stair-shaped pattern, or the like. In other words, fine patterns (such as the resist patterns 21Xb and 23X) and the stair-shaped pattern (resist pattern 21Xa) require less resist material than the base pattern. For example, the amount of resist required to fill a stair-shaped pattern, such as the resist pattern 21Xa, is 50% or less than the amount of resist required to form a base pattern, such as the resist pattern 22X. The amount of the resist by which the stopper pattern 71 is filled is 10% or less of the amount of used to form the resist pattern 22X.

Figure 16A:
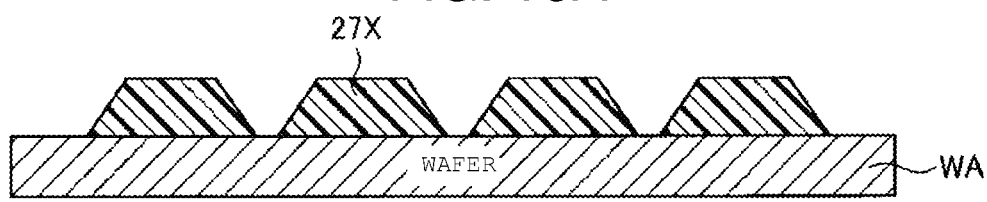
FIGS. 16A to 16C are diagrams that illustrate an example of the sequence of the pattern forming process in a case where a low filling amount portion is formed after the formation of a high filling amount portion.
Figure 16B:
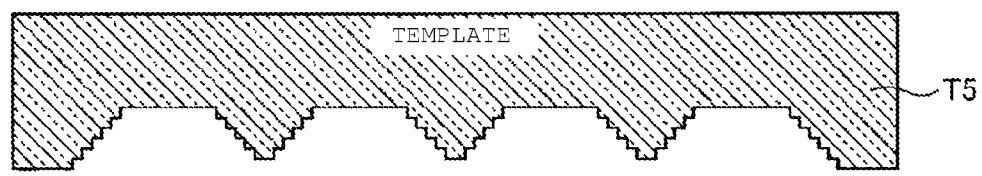
Figure 16C:
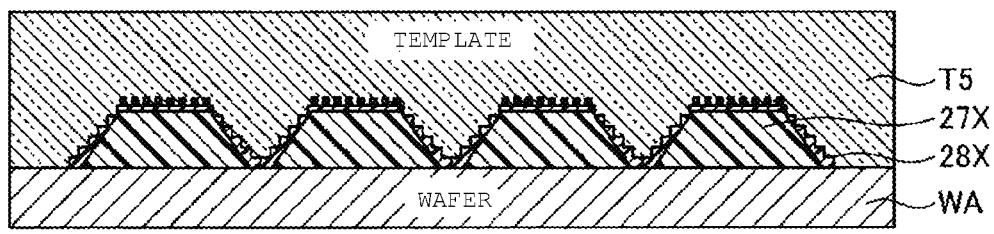

FIGS. 16A to 16C are diagrams that illustrate an example of the sequence of a pattern forming process when a low filling amount portion is formed after a high filling amount portion. FIGS. 16A to 16C illustrate a cross-sectional view of a wafer WA, a template T5, and the like in the pattern forming process. Here, the template T5, similar to the templates T1 to T6, is a template used for forming a resist pattern. Among processes illustrated in FIGS. 16A to 16C, description of processes similar to those illustrated in FIGS. 3A to 3E are not presented.

An imprint apparatus forms a resist pattern 27X that is a high filling amount portion for a wafer WA. The resist pattern 27X is a pattern having protrusions. The resist pattern 27X has portions that are similar to a combination of the resist pattern 22X and a resist pattern 21Xa without the step portions. That is, the resist pattern 27X has an interior portion that is base-like portion, similar to the resist pattern 22X and a peripheral portion similar to an inclined portion of resist pattern 21Xa without the step portions (refer to FIG. 16A).

For example, a portion that becomes the base of the resist pattern 23X includes a parallelepiped pattern in which a fine pattern is formed, and a portion that becomes the base of the resist pattern 21Xa includes an inclining pattern in which a stair-shaped pattern is formed. The formation of the resist pattern 27X may be performed using any method.

The resist pattern 27X, for example, may be formed using an inkjet method. In such a case, a resist is dropped on a wafer WA using the inkjet method, and the resist pattern 27X is formed by curing this resist. In addition, the resist pattern 27X may be formed using an imprint method such as a nano-imprint method. Furthermore, the resist pattern 27X may be formed using a photolithographic method. In such a case, exposure is performed through a photomask for a resist with which a wafer WA is coated, and thereafter, the wafer WA is developed, whereby the resist pattern 27X is formed.

In addition, a template T5 used for forming the fine patterns is prepared. This template T5 is a template used for forming the fine patterns or the stair-shaped patterns (refer to FIG. 16B).

The imprint apparatus dispenses a resist 28A (not illustrated in the drawing) on the wafer WA. This resist 28A is dropped into an area in which a fine pattern, a stair-shaped pattern, or the like is to be formed. Thereafter, the imprint apparatus moves the template T5 to the resist 28A, and the template T5 is brought into contact with the resist 28A.

Accordingly, the resist 28A flows into an area corresponding to the shape of the template pattern. Thereafter, the imprint apparatus shines UV light from above the wafer WA to cause the resist 28A to cure, thereby forming a resist pattern 28X. Then, the imprint apparatus separates the template T5 from the cured resist pattern 28X. Accordingly, a fine pattern and a stair-shaped pattern are formed in the resist pattern 28X (refer to FIG. 16C).

Figure 17:
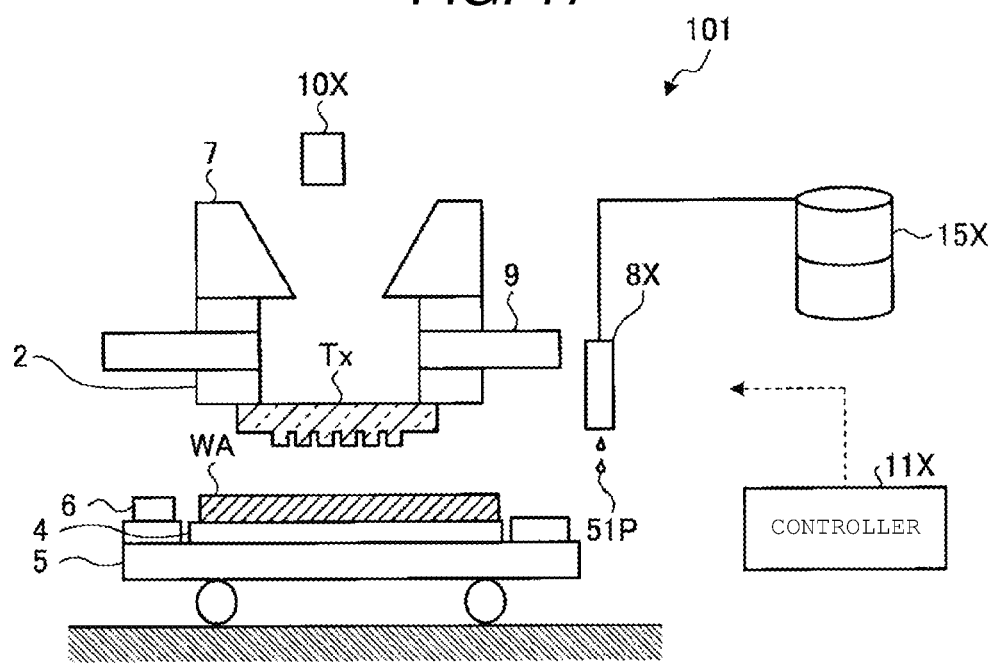
FIG. 17 is a diagram that illustrates a configuration of an imprint apparatus according to an embodiment.

FIG. 17 is a diagram that illustrates the configuration of an imprint apparatus according to an embodiment. The imprint apparatus 101 is a semiconductor manufacturing device that transfers the template pattern of a template Tx onto a transfer target substrate, such as a wafer WA. The imprint apparatus 101 according to this embodiment can emit UV (ultraviolet) light and VUV (vacuum ultraviolet) light onto the wafer WA.

The template Tx is an imprinting mold used for imprint lithography such as nanoimprint lithography (NIL). The template Tx (for example, any one of the templates T1 to T6 described above) is a material transmitting light emitted by the imprint apparatus 101. The template material may be quartz glass or a transparent resin. On the surface (lower face) of the template Tx, a template pattern is formed in a three-dimensional relief shape.

The imprint apparatus 101 includes: a template stage 2; a substrate chuck 4; a sample stage 5; a reference mark 6; an alignment sensor 7; a liquid dispensing device 8X; a template stage base 9; a light source device 10X, a controller 11X; and a resist storage tank 15X.

The sample stage 5 mounts a wafer WA that is a processing target substrate and moves within a horizontal plane parallel to the mounted wafer WA. The sample stage 5 moves the wafer WA below the liquid dispensing device 8X when a resist 51P as a transfer material is being dropped onto the wafer WA and moves the wafer WA below the template Tx when a pattern transfer process is performed. Here, examples of the resist 51P are any of the resists 21A to 23A, 26A, and 28A.

In addition, on the sample stage 5, the substrate chuck 4 is disposed. The substrate chuck 4 fixes the wafer WA to a predetermined position on the sample stage 5. Furthermore, on the sample stage 5, the reference mark 6 is disposed. The reference mark 6 is a mark used for detecting the position of the sample stage 5 and is used for positioning the wafer WA on the sample stage 5 at wafer loading time.

On the bottom face (facing towards the wafer WA) of the stage base 9, the template stage 2 is disposed. The template stage 2 fixes the template Tx at a predetermined position by the face (rear face) on the side template TX on which a template pattern is not formed.

The stage base 9 supports the template Tx using the template stage 2 and includes a pressing mechanism for pressing the template pattern of the template Tx into the resist 51P disposed on the wafer WA. According to movement in the upward/downward direction (vertical direction in FIG. 17), the stage base 9 presses the template Tx or separates (releases) the template Tx from the resist 51P. The resist 51P used for imprinting, for example, includes a resin (light curing agent) having light curability or the like. In addition, the alignment sensor 7 is disposed on the stage base 9. The alignment sensor 7 is a sensor for detecting the position of the wafer WA or detecting the position of the template Tx relative to the wafer.

The resist storage tank 15X is a tank storing a resist material. The resist tank 15X is connected to the liquid dispensing device 8X. The liquid dispensing device 8X is a device, such as an inkjet device, that dispenses the resist 51P from the resist storage tank 15X onto the wafer WA. The liquid dropping device 8X in this example includes an ink jet head. The ink jet head includes a plurality of fine holes ejecting liquid droplets of the resist 51P.

An inkjet system can supply the resist 51P as necessary to the wafer WA in consideration of the pattern coverage ratio and the positions of fine patterns included in the template Tx. For this reason, the inkjet system has superior efficiency in controlling the film thickness of patterns formed with the resist 51P.

The light source device 10X, also referred to as light emitting unit 10X, is a device that emits light and is disposed above the stage base 9. The light source device 10X emits light through the transparent template Tx while the template Tx is being pressed to the resist 51P. In addition, the light emitted by the light source device 10X may be any one of visible light, infrared light, ultraviolet light, and the like as long as the light can be used for curing the resist 51P.

While a controller 11X is illustrated specific connections of the controller 11X are not illustrated; however, the controller 11X can be connected to each constituent element of the imprint apparatus 101 and controls each constituent element. For example, the controller 11X controls the liquid dispensing device 8X when the resist 51P is being dispensed onto the wafer WA.

When imprinting is performed, the wafer WA mounted on the sample stage 5 is moved to a position directly below the liquid dispensing device 8X. The wafer WA includes shot areas arranged in a lattice pattern, and the liquid dispensing device 8X can drop resist 51P in each shot area. Accordingly, the predetermined shot position of the wafer WA is moved below the liquid dropping device 8X. Then, the liquid dropping device 8X dispenses the resist 51P to the shot position.

Thereafter, the wafer WA (still on the sample stage 5) is moved to a position directly below the template Tx. Then, the template Tx is pressed into the resist 51P that was dispensed onto the wafer WA. Accordingly, the template Tx and the resist 51P are brought into contact with each other for a predetermined time period (a template filling time).

Then, after the resist 51P fills in the template pattern, the light source device 10X emits light to the resist 51P. Accordingly, the resist 51P is cured, and, as a result, a transferred pattern corresponding to the template pattern is formed in the resist 51P disposed on the wafer WA. Thereafter, the template Tx is separated from the patterned, cured resist 51P. Then, a pattern forming process for the next shot area is performed. Thereafter, the pattern forming process for all the shot areas on the wafer WA is eventually completed.

In addition, the imprint apparatus 101 may emit only UV light using the light source device 10X or may emit UV light and VUV light using the light source device 10X. Here, configuration examples of the light source device 10X when UV light and VUV light are emitted using the light source device 10X will be described.

Figure 18A:
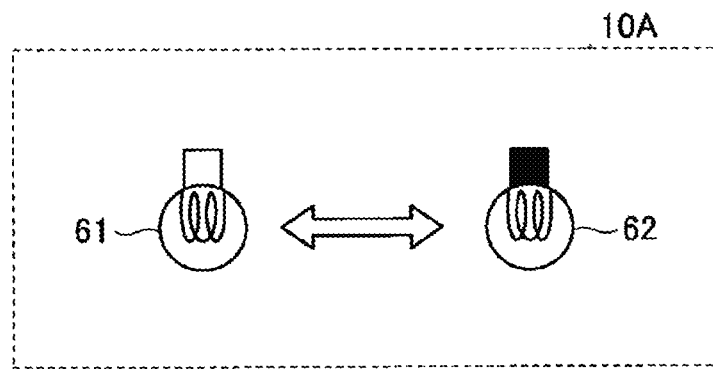
FIGS. 18A and 18B are diagrams that illustrate examples of a configuration of a light source device according to an embodiment.
Figure 18B:
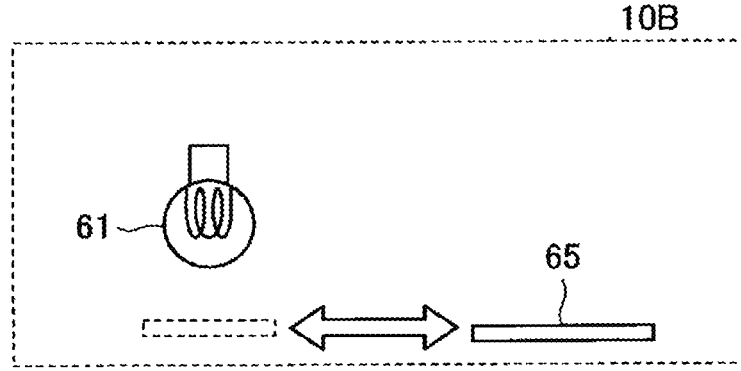

FIGS. 18A and 18B are diagrams that illustrate examples of the configuration of a light source device according to an embodiment. A light source device 10A illustrated in FIG. 18A is a first configuration example of the light source device 10X, and a light source device 10B illustrated in FIG. 18B is a second configuration example of the light source device 10X.

As illustrated in FIG. 18A, the light source device 10A includes a light source 61 and a light source 62. The light source 61 is a light source outputting UV light, and the light source 62 is a light source outputting VUV light. A controller 11X is connected to the light source device 10A and performs switching between the output from the light source 61 and the output from the light source 62. The controller 11X outputs UV light from the light source 61 when the UV light is emitted to the wafer WA and outputs VUV light from the light source 62 when the VUV light is emitted to the wafer WA.

In addition, as illustrated in FIG. 18B, the light source device 10B includes a light source 61 and a filter 65. The filter 65 filters UV light from the output of the light source to leave VUV light. A controller 11X of this case is connected to the light source device 10B and performs switching between the UV and VUV output of light through the positioning of filter 65.

Here, when VUV light is to be emitted to the wafer WA, the controller 11X causes the light source 61 to emit light to the wafer WA through the filter 65. On the other hand, when UV light is to be emitted to the wafer WA, the controller 11X causes the light source 61 to emit light to the wafer WA without passing the emitted light through the filter 65. In addition, when UV light is to be emitted to the wafer WA, the controller 11X may also cut off VUV light (e.g., place a different filter in the light emission pathway).

When VUV light is emitted to the wafer WA, the controller 11X moves the filter 65 to be between the light source 61 and the wafer WA. Accordingly, only VUV light supplied through the filter 65 is emitted to the wafer WA. On the other hand, when UV light is emitted to the wafer WA, the controller 11X moves the filter 65 such that the filter 65 is not between the light source 61 and the wafer WA. Accordingly, UV light supplied from the light source 61 is emitted to the wafer WA without filtering.

Figure 19A:
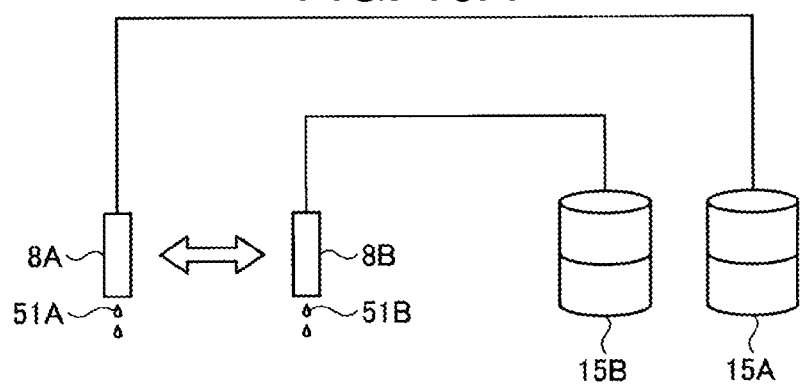
FIGS. 19A and 19B are diagrams that illustrate other configuration examples of a liquid dispensing device according to an embodiment.
Figure 19B:
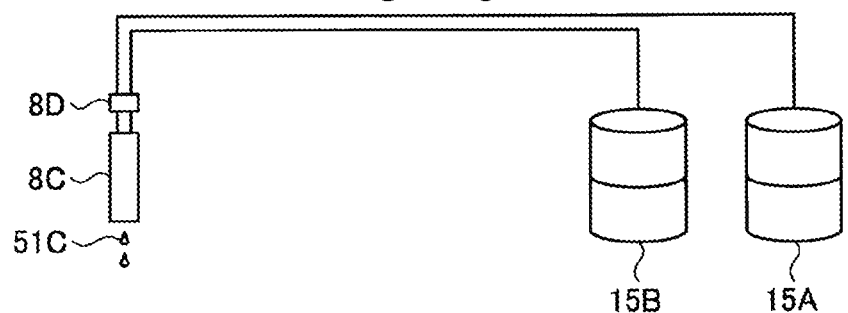

In addition, the imprint apparatus 101 may dispense a many different kinds of resist onto the wafer WA. Here, the configuration of an imprint apparatus including a plurality of liquid dispensing devices will be described. FIGS. 19A and 19B are diagrams that illustrate other configuration examples of a liquid dispensing device according to an embodiment. FIG. 19A illustrates a configuration example of liquid dispensing devices 8A and 8B, and FIG. 19B illustrates a configuration example of a liquid dropping device 8C. The liquid dropping devices 8A to 8C are devices similar to the liquid dropping device 8X.

In a case where the imprint apparatus 101 dispenses different kinds of resist onto the wafer WA, the imprint apparatus 101 includes liquid dispensing devices 8A and 8B or a liquid dispensing device 8C instead of the liquid dropping device 8X. In such a case, the imprint apparatus 101 includes two resist storage tanks 15A and 15B instead of a single resist storage tank 15X. For example, a resist 51A is stored in the resist tank 15A, and a resist 51B is stored in the resist tank 15B. While the resists 51A and 51B are resists similar, in general, to the resist 51P, the resist 51A and the resist 51B are resists of different from one another in some characteristic. The resists 51A and 51B, for example, could be any one of the resists 21A to 23A, 26A, and 28A described above.

In a case where the imprint apparatus 101 includes the liquid dispensing devices 8A and 8B instead of the liquid dropping device 8X, the liquid dispensing device 8A is connected to the resist tank 15A, and the liquid dispensing device 8B is connected to the resist tank 15B (refer to FIG. 19A).

The controller 11X causes the liquid dispensing device 8A to dispense the resist 51A into a first predetermined area within an imprint area of the wafer WA. In addition, the controller 11X causes the liquid dispensing device 8B to dispense the resist 51B into a second predetermined area within the imprint shot area.

When the resist 51A is dispensed, the controller 11X moves the liquid dropping device 8A to a liquid dispensing position. On the other hand, when the resist 51B is dispensed, the controller 11X moves the liquid dispensing device 8B to the liquid dropping position.

For example, when the pattern forming process of a bathtub type is being performed, the following processes of (1A) to (6A) are sequentially performed.

(1A) A wafer WA is moved to an inkjet unit location, for example a position below the liquid dispensing device 8A, and the resist 51A is dispensed onto the wafer WA.

(2A) The wafer WA is moved to an imprint unit location, the template Tx is pressed into the resist 51A, and the template Tx is filled with the resist 51A.

(3A) The resist 51A is cured.

(4A) The template Tx is separated from the resist 51A and a corresponding resist pattern is left on the wafer WA.

(5A) The wafer WA is moved to the inkjet unit location, this time below the liquid dispensing device 8B, and the resist 51B is dispensed onto the wafer WA.
(6A) The resist 51B is cured.

When the pattern forming process of the base type is performed, the following processes of (1B) to (6B) are sequentially performed.
(1B) A wafer WA is moved to an inkjet unit location, for example, below the liquid dropping device 8B, and the resist 51B is dispensed onto the wafer WA.
(2B) The resist 51B is cured.
(3B) The wafer WA is moved to the inkjet unit location, this time below the liquid dropping device 8A, and the resist 51A is dispensed onto the wafer WA.
(4B) The wafer WA is moved to an imprint unit location, the template Tx is pressed into the resist 51A, and the template Tx is filled with the resist 51A.
(5B) The resist 51A is cured.
(6B) The template Tx is separated from the resist 51A, leaving a corresponding resist pattern on the wafer WA.

In addition, there an embodiment in which the light source device 10X is separately disposed in a curing unit outside than the imprint unit. The curing unit is a device that causes a resist to cure. In such a case, in the case of the pattern forming process of either the base type or the bathtub type, after the wafer WA is moved to a dispensing unit, the resists 51A and 51B are dispensed by the dispensed unit. Then, after the wafer WA is moved to the curing unit, UV light is emitted to the resists 51A and 51B by the curing unit, whereby the curing process of the resists 51A and 51B is performed.

In addition, an imprint apparatus 101 may be configured such that the number of liquid dispensing devices (e.g., inkjet heads) and the number of light sources match. In such a case, in a case where the N-th resist is dispensed onto a wafer WA by an N-th liquid dispensing device, an N-th light source is used to cause the N-th resist to cure. Here, N is a natural number of two or more. In such a case, the number of imprint heads for pressing a template Tx into the resist(s) may be less than the number of the liquid dispensing devices or the light sources.

For example, the imprint apparatus 101 may include two liquid dropping devices, two light sources, and one imprint head. In such a case, in the process of (2B) described above, a first light source emits UV light to cause a resist 51A to cure. In addition, in the process of (4B) described above, a second light source emits UV light to cause a resist 51B to cure. In this case, VUV light may be emitted to the wafer WA using the first light source, or VUV light may be emitted to the wafer WA using the second light source.

In a case where the imprint apparatus 101 includes the liquid dispensing device 8C instead of the liquid dispensing device 8X, the liquid dispensing device 8C is connected to the resist tanks 15A and 15B. In addition, the imprint apparatus 101 includes a switching device 8D connected to the liquid dispensing device 8C. The switching device 8D is a device performing switching between the kinds of resist 51C to be sent out. The controller 11X switches the type of resist 51C to be sent to the liquid dispensing device 8C to one of the resists 51A and 51B by controlling the switching device 8D (refer to FIG. 19B).

When the resist 51A is to be dropped into the imprint shot, the controller 11X performs control of the switching device 8D such that the switching device 8D sends the resist 51A to the liquid dispensing device 8C. Accordingly, the liquid dispensing device 8C dispenses the resist 51A onto the wafer WA.

On the other hand, when the resist 51B is dropped into the imprint shot, the controller 11X performs control of the switching device 8D such that the switching device 8D sends the resist 51B to the liquid dispensing device 8C. Accordingly, the liquid dispensing device 8C dispenses the resist 51B onto the wafer WA.

In this embodiment, while a case is described in which the imprint apparatus 101 performs the dispensing process of a resist and the curing process of a resist, any other device may perform the dispensing process of a resist or the curing process of a resist. In such a case, for example, a pattern forming apparatus performing the dispensing process of a resist and the curing process of a resist is used.

Figure 20:
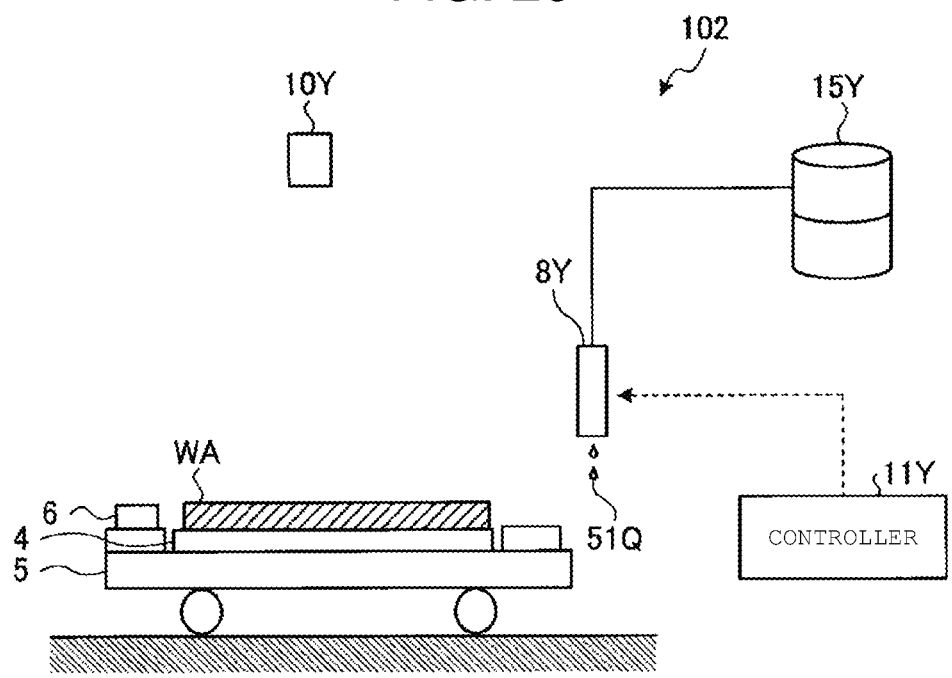
FIG. 20 is a diagram that illustrates a configuration of a pattern forming apparatus according to an embodiment.

FIG. 20 is a diagram that illustrates the configuration of a pattern forming apparatus according to an embodiment. A same reference numeral is assigned to a constituent element achieving the same function as that of the imprint apparatus 101 illustrated in FIG. 17 among constituent elements illustrated in FIG. 20, and duplicate description will not be presented.

The pattern forming apparatus 102 is a device performing a dispensing process of a resist and a curing process of a resist for a transfer target substrate such as a wafer WA. The pattern forming apparatus 102, for example, performs the formation of a base pattern, embedding of a resist into an area surrounded by a wall pattern having a bathtub shape, and the like.

The pattern forming apparatus 102 includes: a substrate chuck 4; a sample stage 5; a reference mark 6; a liquid dispensing device 8Y; a light source device 10Y; a controller 11Y; and a resist tank 15Y.

The liquid dispensing device 8Y, the light source device 10Y, the controller 11Y, and the resist tank 15Y respectively have configurations similar to the liquid dispensing device 8X, the light source device 10X, the controller 11X, and the resist tank 15X. Thus, the pattern forming apparatus 102 may include a light source device 10A or a light source device 10B as the light source device 10Y. In addition, the pattern forming apparatus 102 may include liquid dispensing devices 8A and 8B instead of the liquid dispensing device 8Y or may include a liquid dispensing device 8C instead of the liquid dispensing device 8Y.

The sample stage 5 moves a wafer WA below the liquid dispensing device 8Y when a resist 51Q as a transfer material is dropped onto the wafer WA and moves the wafer WA below the light source device 10Y when the curing process of the resist 51Q is performed.

While not illustrated in the drawing, the controller 11Y is connected to each constituent element of the pattern forming apparatus 102 and controls each constituent element. When a resist 51Q is dropped onto the wafer WA, the controller 11Y controls the liquid dispensing device 8Y. The resist 51Q is a resist 51A or 51B or the like.

When a pattern is formed on the wafer, the wafer WA is moved to a position right below the liquid dispensing device 8Y. Then, the resist 51Q is dropped to a predetermined position on the wafer WA. Thereafter, the wafer WA mounted on the sample stage 5 is moved to a position right below the light source device 10Y.

Then, the light source device 10Y emits VUV light to the resist 51Q.

Thereafter, the light source device 10Y emits UV light to the resist 51Q. Accordingly, the resist 51Q is cured, and a resist pattern is formed. Thereafter, the pattern forming process for a next shot is performed. Then, when the pattern forming process for all the shots disposed on the wafer WA is completed, the wafer WA is carried out.

In addition, the pattern forming apparatus 102 may be configured such that the number of liquid dispensing devices (e.g., inkjet heads) and the number of light sources are the same. In such a case, in a case where an M-th resist is dropped onto the wafer WA by an M-th) liquid device, an M-th light source causes the M-th resist to cure. Here, M is a natural number.

Figure 21:
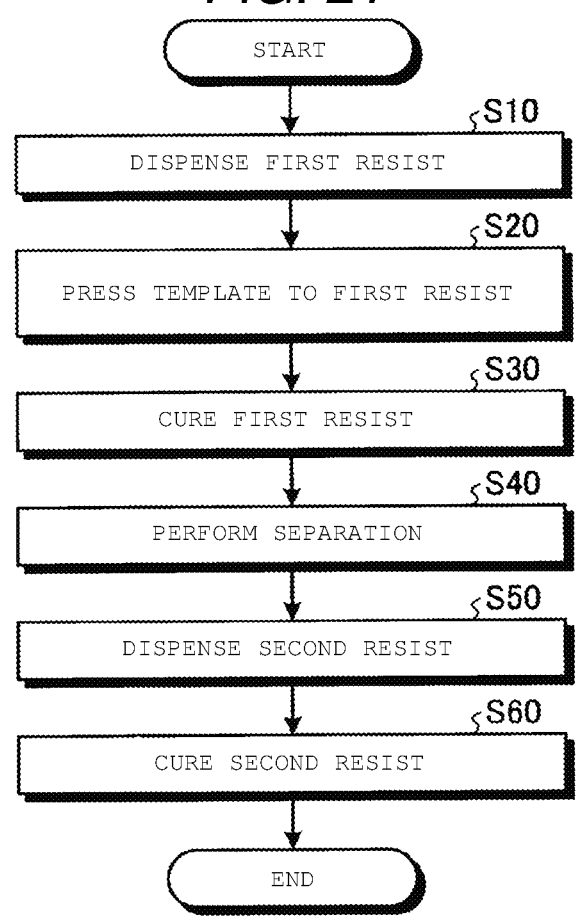
FIG. 21 is a flowchart that illustrates aspects of a processing sequence of a resist pattern forming process using the imprint apparatus or pattern forming apparatus according to an embodiment.

FIG. 21 is a flowchart that illustrates the processing sequence of a resist pattern forming process using an imprint apparatus according to an embodiment or a pattern forming apparatus according to an embodiment. The imprint apparatus 101 dispenses a first resist onto the wafer WA (Step S10). In addition, the pattern forming apparatus 102 may drop the first resist.

Thereafter, the imprint apparatus 101 presses the template Tx to the first resist (Step S20). In addition, the imprint apparatus 101 emits UV light or the like to the first resist to cause the first resist to cure (Step S30). Then, the imprint apparatus 101 separates the template Tx from the cured first resist (Step S40).

Then, the imprint apparatus 101 or the pattern forming apparatus 102 dispenses the second resist onto the wafer WA (Step S50). In addition, the imprint apparatus 101 or the pattern forming apparatus 102 emits UV light or the like to the second resist to cause the second resist to cure (Step S60). Accordingly, a resist pattern formed by the first and second resists is formed.

In this embodiment, while a case is illustrated in which the high filling amount portion (the second area 32 illustrated in FIGS. 1A and 1B) is filled with the resist 22A or the like, a guide pattern may be formed in the second area 32 in advance. By forming such a guide pattern, the film thickness of the resist pattern 22X is stabilized.

FIG. 22 is a diagram that illustrates a guide pattern. In a case where a wall pattern having a bathtub shape is formed by the resist pattern 21Ya, there are cases where the film thickness of the resist 22B disposed inside a bathtub area that is a high filling amount portion is unstable.

In a case where a guide pattern 24 is formed inside the high filling amount portion (bathtub area) surrounded by the resist pattern 21Xa, the film thickness of the resist 22C with which the high filling amount portion is filled is stable.

The guide pattern 24 is a resist pattern formed by a same process as the process of the formation of the resist pattern 21Xa. The guide pattern 24, for example, is a pattern of a pillar shape having an approximately the same height as the resist pattern 21Xa.

The guide patterns 24, for example, are arranged inside an area surrounded by the resist pattern 21Xa at a predetermined interval. In this case, the guide patterns 24 are disposed at a pitch longer than the drop size of the resist 22C. In other words, a measurement gap between the guide patterns 24 is larger than the drop size of the resist 22C. In addition, a measurement gap between the resist pattern 21Xa and the guide pattern 24 is larger than the drop size of the resist 22C.

After forming the resist pattern 21Xa and the guide pattern 24, the imprint apparatus 101 dispenses the resist 22C into an area surrounded by the resist pattern 21Xa. At this time, the imprint apparatus 101 selectively dispenses the resist 22C at least at positions at which the guide patterns 24 are not formed within the area surrounded by the resist pattern 21Xa. In this case, the imprint apparatus 101 dispenses the resist 22C such that the area surrounded by the resist pattern 21Xa is filled with the guide patterns 24 and a resist pattern acquired by curing the resist 22C.

According to the configuration of such guide patterns 24, a space between the guide patterns 24 and a space between the resist pattern 21Xa and the guide pattern 24 can be easily filled with the resist 22C. In addition, up to a same height as that of the resist pattern 21Xa can be easily filled with the resist 22C having a uniform film thickness.

In addition, since the guide pattern 24 is formed simultaneously with the resist pattern 21Xa, a template pattern corresponding to the guide pattern 24 is formed in the template used when the resist pattern 21Xa is formed.

The shape of the guide pattern 24 may have any shape without being limited to the shape described above. In addition, the guide pattern 24 and the resist pattern 21Xa may be formed as an integral pattern. FIG. 23 is a diagram that illustrates an example of another pattern shape of the guide pattern. FIG. 23 illustrates a cross-sectional shape of a resist pattern 46. The resist pattern 46 includes a guide pattern 45 and a resist pattern 21Xa. The guide pattern 45, similar to the resist pattern 21Xa, has a cross-sectional shape of a stair shape.

The resist pattern 46 has stair-shaped patterns on both a first side face and a second side face opposing the first side face. The stair-shaped pattern formed on the first side face is the resist pattern 21Xa described with reference to FIG. 22 and the like. In addition, the stair-shaped pattern formed on the second side face is a guide pattern 45. This guide pattern 45 is formed inside an area (corresponding to the second area 32 illustrated in FIGS. 1A and 1B) surrounded by the resist pattern 21Xa. The guide pattern 45 and the resist pattern 21Xa have a plane-symmetrical shape having a boundary face thereof as a symmetrical plane.

In this way, in a case where the guide pattern 45 has the stair-shaped pattern on the second side face, an area near the bottom portion (lowest stage) of this stair-shaped pattern can be easily filled with the resist 22C. In addition, the guide pattern 45 may be a pattern having an inclining face without being limited to the stair-shaped pattern.

Here, configuration examples of various templates having the guide patterns 24 and 45 and the like will be described. FIGS. 24A to 24D are diagrams that illustrate a configuration example (1) of a template, and FIGS. 24E to 24H are diagrams that illustrate a configuration example (2) of a template. FIGS. 24A to 24H illustrate top views of templates T8a to T8h when the templates T8a to T8h are seen from the template pattern face side. FIGS. 24A to 24H illustrate the shapes of top faces when the templates T8a to T8h are seen from the template pattern face side. Since the guide patterns 24 and 45 have the same shape of the top faces, here, a case of the guide pattern 45 will be described.

In the templates T8a to T8h, portions of the template patterns to which hatching is not applied are protrusion portions (a cross-sectional shape of a protrusion shape) (protrusion pattern) in the template patterns. On the other hand, portions of the template patterns to which hatching is applied are recess portions (a cross-sectional shape of a recess shape) (recess pattern) and become guide patterns 45. More specifically, protrusion patterns 82B to 82G to be described later are guide patterns 45.

Each of the templates T8a to T8h has a recess pattern 80 as a template pattern corresponding to a wall pattern of a bathtub shape. In other words, in each of the templates T8a to T8h, the recess pattern 80 is formed as a recess-portion area filled with a resist that becomes a wall pattern of the bathtub shape. The recess pattern 80 forms a rectangular annular shape when seen from the top face.

The template T8a illustrated in FIG. 24A does not have a guide pattern. The template T8a includes a recess pattern 80 and a protrusion pattern 81a. The protrusion pattern 81a is a rectangular-shaped pattern surrounded by the recess pattern 80. In addition, in the template T8a, when the unevenness of the recess pattern 80 and the protrusion patterns 81a are reversed, the template becomes a template similar to the templates T1 to T4.

The template T8b illustrated in FIG. 24B includes a recess pattern 80, a recess pattern 82B, and protrusion patterns 81b. A plurality of the protrusion patterns 81b are patterns having a columnar shape. The shape of the top face of the protrusion pattern 81b has a rectangular shape. The protrusion patterns 81b are disposed at positions close to the recess pattern 80 in a further inner area than the recess pattern 80. The protrusion patterns 81b are arranged in a rectangular annular shape at a predetermined interval.

The recess pattern 82B is disposed at a position close to the protrusion patterns 81b in a further inner area than the protrusion patterns 81b. The recess pattern 82B is a rectangular-shaped pattern surrounded by the protrusion patterns 81b. The recess pattern 82B is a pattern that becomes a take-in area taking air bubbles generated inside the resist 35 to be described later therein.

The template T8c illustrated in FIG. 24C includes a recess pattern 80, recess patterns 82C that are guide patterns, and protrusion patterns 81c. A plurality of the protrusion patterns 81c are patterns having a columnar shape. The shape of the top face of the protrusion pattern 81c forms a rectangular shape. The protrusion patterns 81c are disposed on a further inner area than the recess pattern 80. The protrusion patterns 81c are disposed the vertexes of a matrix configuration at a first interval.

The recess patterns 82C are arranged in a vertical and horizontal lattice shape in areas in which the protrusion patterns 81c are not disposed in a further inner area than the recess pattern 80. The protrusion pattern 81c and the recess pattern 82C are adjacent to each other inside an area having a rectangular shape surrounded by the recess pattern 80.

The template T8d illustrated in FIG. 24D includes a recess pattern 80, recess patterns 82D that are guide patterns, and protrusion patterns 81d. The arrangement interval of the protrusion patterns 81d is larger than that of the protrusion patterns 81c of the template T8c. A plurality of the protrusion patterns 81d are patterns having a columnar shape. The shape of the top face of the protrusion pattern 81d has a rectangular shape. The protrusion patterns 81d are disposed in a further inner area than the recess pattern 80. The protrusion patterns 81d are disposed at the vertexes of a matrix configuration at a second interval larger than the first interval. The recess patterns 82D are disposed in a vertical and horizontal lattice shape in areas in which the protrusion patterns 81d are not disposed in a further inner area than the recess pattern 80. The protrusion pattern 81d and the recess pattern 82D are disposed to be adjacent to each other within an area having a rectangular area surrounded by the recess pattern 80.

The template T8e illustrated in FIG. 24E includes a recess pattern 80, recess patterns 82E that are guide patterns, and protrusion patterns 81e. A plurality of the protrusion patterns 81e are patterns having a columnar shape. The shape of the top face of the protrusion pattern 81e forms a rectangular shape.

The protrusion patterns 81e are arranged in a horizontal lattice pattern in areas in which the recess patterns 82E are not disposed in a further inner area than the recess pattern 80. In addition, the recess patterns 82E are arranged in a horizontal lattice pattern in areas in which the protrusion patterns 81e are not disposed in a further inner area than the recess pattern 80. The protrusion patterns 81e are disposed between the recess patterns 82E and are disposed at a first interval in the vertical direction. The recess patterns 82E are disposed between the protrusion patterns 81e and are disposed at a second interval in the vertical direction. The first interval is the same as the length of the recess pattern 82E in the lateral direction, and the second interval is the same as the length of the protrusion pattern 81e in the lateral direction.

In this way, the protrusion patterns 81e and the recess patterns 82E are alternately disposed to be adjacent to each other within an area having a rectangular shape surrounded by the recess pattern 80. The length of the area having the rectangular shape surrounded by the recess pattern 80 in the lateral direction, the length of the protrusion pattern 81e in the longitudinal direction (horizontal direction), and the length of the recess pattern 82E in the longitudinal direction (horizontal direction) are the same.

The template T8f illustrated in FIG. 24F includes a recess pattern 80, recess patterns 82F, and protrusion patterns 81f. A plurality of the protrusion patterns 81f are patterns having a columnar shape. The shape of the top face of the protrusion pattern 81f has a rectangular shape. The arrangement interval of the recess patterns 82F is longer than that of the recess patterns 82E of the template T8e.

The protrusion patterns 81f are arranged in a horizontal lattice pattern in areas in which the recess patterns 82F are not disposed in a further inner area than the recess pattern 80. In addition, the recess patterns 82F are arranged in a horizontal lattice pattern in areas in which the protrusion patterns 81f are not disposed in a further inner area than the recess pattern 80. The protrusion patterns 81f are disposed between the recess patterns 82F and are disposed at a third interval in the vertical direction. The recess patterns 82F are disposed between the protrusion patterns 81f and are disposed at a fourth interval in the vertical direction. The third interval is the same as the length of the recess pattern 82F in the lateral direction, and the fourth interval is the same as the length of the protrusion pattern 81f in the lateral direction.

In this way, the protrusion patterns 81f and the recess patterns 82F are alternately provided to be adjacent to each other within an area having a rectangular shape surrounded by the recess pattern 80. The length of the area having the rectangular shape surrounded by the recess pattern 80 in the lateral direction, the length of the protrusion pattern 81f in the longitudinal direction (horizontal direction), and the length of the recess pattern 82F in the longitudinal direction (horizontal direction) are the same.

The template T8g illustrated in FIG. 24G includes a recess pattern 80, a recess pattern 82G that is a guide pattern, and protrusion patterns 81ga and 81gb. A plurality of the protrusion patterns 81ga are patterns having a columnar shape. The shape of the top face of the protrusion pattern 81ga forms an "L" shape. The protrusion patterns 81ga are disposed at positions close to the recess pattern 80 in a further inner area than the recess pattern 80. The protrusion patterns 81ga are arranged in an approximate rectangular annular shape. The recess pattern 82G is disposed at a position close to the protrusion patterns 81ga in a further inner area than the protrusion patterns 81ga. The recess pattern 82G is arranged in an approximate rectangular annular shape. The protrusion pattern 81gb is disposed at a position close to the recess pattern 82G in a further inner area than the recess pattern 82G. The protrusion pattern 81gb is a pattern having a rectangular shape surrounded by the recess pattern 82G.

The recess pattern 82G is connected to the recess pattern 80 at center points of the recess pattern 82G. In other words, a part of the protrusion pattern 81ga is divided by a pattern joining the recess pattern 80 and the recess pattern 82G. Accordingly, the protrusion pattern 81ga has an "L" shape. According to such a configuration, the strength of the protrusion pattern 81ga becomes higher than that of the case of a complete rectangular annular shape.

The template T8h illustrated in FIG. 24H includes a recess pattern 80, a recess pattern 82H that is a guide pattern, and protrusion patterns 81ha and 81hb. A plurality of the protrusion patterns 81ha are patterns having a columnar shape. The shape of the top face of the protrusion pattern 81ha has a rectangular shape. The number of protrusion patterns 81ha is more than that of the protrusion patterns 81ga of the template T8g.

The protrusion patterns 81ha are disposed at positions close to the recess pattern 80 in a further inner area than the recess pattern 80. The protrusion pattern 81ha is arranged in an approximate rectangular annular shape. The recess pattern 82H is disposed at a position close to the recess pattern 82G in a further inner area than the protrusion patterns 81ha. The recess pattern 82H is arranged in an approximate rectangular annular shape. The protrusion pattern 81gb is disposed at a position close to the recess pattern 82H in a further inner area than the recess pattern 82H. The protrusion pattern 81hb is a pattern having a rectangular shape surrounded by the recess pattern 82H.

The recess pattern 82H is connected to the recess pattern 80 at a plurality of positions of each side of the recess pattern 82H. In other words, a part of the protrusion pattern 81ha is divided by a pattern joining the recess pattern 80 and the recess pattern 82H. Thus, the protrusion pattern 81ha has a rectangular shape. According to such a configuration, the strength of the protrusion pattern 81ha is higher than that of the case of a complete rectangular annular shape. In addition, the recess pattern 80 of each of the templates T8a to T8h may include the stopper patterns 71 and 72 described with reference to FIG. 14.

Among the recess patterns 82C to 82H, a portion into which a resist is not dropped or a portion in which a resist is insufficient becomes a hollow at the time of performing imprinting. This hollow is an in-take area in which air bubbles are taken. Thus, the recess patterns 82C to 82H are patterns taking in air bubbles in accordance with the dispensed amount of the resist.

Figure 25A:
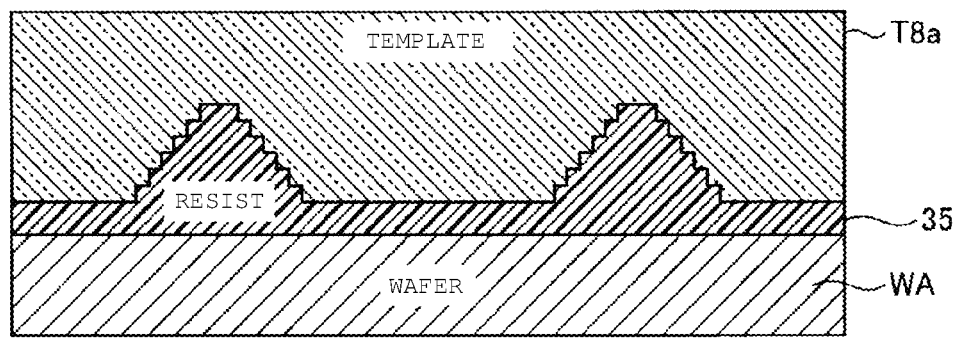
FIGS. 25A to 25C are diagrams that illustrate an arrangement position of the resist.
Figure 25B:
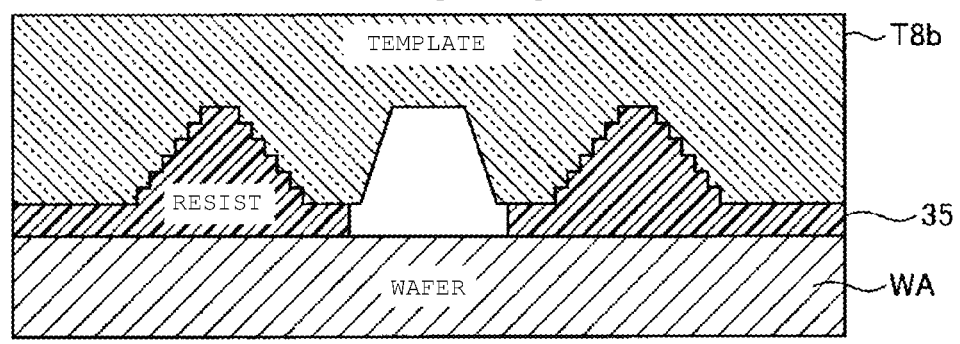
Figure 25C:
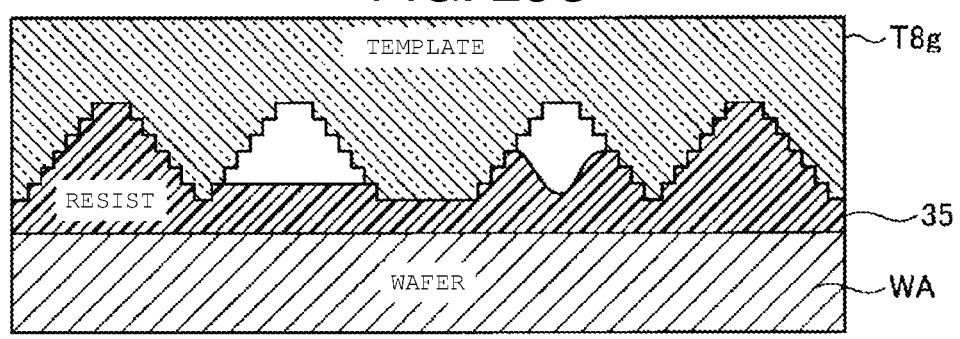

Next, the arrangement position of a resist when the template described with reference to FIGS. 24A to 24H is used will be described. FIGS. 25A to 25C are diagrams that illustrate the arrangement position of a resist. FIGS. 25A to 25C illustrate cross-sectional views of the templates T8a, T8b, and T8g.

As illustrated in FIG. 25A, in a case where the template T8a is used, the resist 35 is provided on the whole face of the wafer WA. Accordingly, a resist residual layer thickness (RLT) portion between the template T8a and the wafer WA and the template pattern (e.g., the recess pattern 80) are filled with the resist 35.

As illustrated in FIG. 25B, in a case where the template T8b is used, in the wafer WA, in an area that is the recess portion (e.g., the recess pattern 80) of the template pattern and on the periphery thereof, the resist 35 is disposed. In other words, in an inner area of the bathtub shape, the resist 35 is not disposed. In this way, in a case where the template T8b is used, the dispensing position and the dispensed amount of the resist 35 are adjusted.

Accordingly, when the template T8b is pressed to the resist 35, a resist residual layer thickness portion between the wafer WA and the template and a portion of the template pattern in which the resist 35 is disposed are filled with the resist 35. At this time, a hollow area is secured in the inner area of the bathtub shape. Accordingly, air bubbles generated inside the resist 35 can be accumulated in the hollow between the template T8b and the resist 35. As a result, it can be prevented that air bubbles remain inside the resist 35 at curing.

As illustrated in FIG. 25C, in a case where the template T8g is used, in the wafer WA, in an area that is pressed by the recess portion of the template pattern and on the periphery thereof, the resist 35 is disposed. In other words, in an inner area of the bathtub shape, the resist 35 is not disposed. In this way, in a case where the template T8g is used, the dispensing position and the dispensed amount of the resist 35 are adjusted.

Accordingly, when the template T8g is pressed into the resist 35, a resist residual layer thickness portion between the wafer WA and the template and a portion of the template pattern in which the resist 35 is disposed are filled with the resist 35. At this time, a hollow is secured in the inner area of the bathtub shape. Accordingly, air bubbles generated inside the resist 35 are taken into the hollow between the template T8g and the resist 35. As a result, it can be prevented that air bubbles remain inside the resist 35.

Similarly, when any one of the templates T8c to T8f and T8h is pressed to the resist 35, a resist residual layer thickness portion between the wafer WA and the template and a portion of the template pattern in which the resist 35 is disposed are filled with the resist 35. At this time, when the dispensed amount of the resist 35 is adjusted, a hollow is secured in the inner area of the bathtub shape. Accordingly, air bubbles generated inside the resist 35 are taken into the hollow between the templates T8c to T8f and T8h and the resist 35. As a result, it can be prevented that air bubbles remain inside the resist 35.

The formation of a resist pattern using the imprint apparatus 101 or the pattern forming apparatus 102 is, for example, performed for each layer of a wafer processing. In this way, a semiconductor device (semiconductor integrated circuit) 1 can be manufactured. When the semiconductor device 1 is manufactured, the dispensing process of a resist, a resist pattern forming process, an etching process using the resist pattern as a mask, and the like are repeated for each layer.

In this way, according to an embodiment, the formation of any one of the resist patterns 21Xa, 21Xb, and 23X having the first film thickness using the imprint lithography and the formation of the resist pattern 22X having the second film thickness through the dispensing process and the curing process of the resist are performed. Accordingly, patterns having various film thicknesses can be formed at low cost while processing defects are limited.

In addition, since the resist pattern 21Xa is formed in an annular shape, the embedding of the resist 22A can be easily performed. Furthermore, since VUV light is emitted onto the resist pattern 21Xa, the adhesiveness between the resist pattern 21Xa and the resist pattern 22X can be improved. In addition, since the guide patterns 24 and 45 are formed in the second area 32, the film thickness of the resist pattern 22X is stable.

Furthermore, in a case where the stopper pattern 71 is provided, the stopper pattern 71 can prevent the resist 26A from flowing outwardly. In addition, in a case where the stopper pattern 72 is provided, a hollow is generated between the template T6 and the resist 26A, and accordingly, air bubbles generated inside the resist 26A can be taken into the hollow. Accordingly, it can be prevented that air bubbles remain inside the resist 35 at curing. Furthermore, by adjusting the dispensing position and the dispensed amount of the resist 35, a hollow can be generated between any one of the templates T8b to T8g and the resist 35, and accordingly, air bubbles generated inside the resist 35 can be taken into the hollow. Therefore, it can be prevented that air bubbles remain inside the resist 35 at curing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   dispensing an uncured first resist material on to a substrate in a first resist pattern;
   curing the uncured first resist material with a first light to form a cured first resist pattern on the substrate;
   exposing the cured first resist pattern to a second light;
   dispensing an uncured second resist material on to the cured first resist pattern; and
   contacting the uncured second resist material with a patterned imprint template and curing the uncured second resist material.

2. The pattern forming method according to claim 1, wherein the first light is an ultraviolet wavelength and the second light is a vacuum ultraviolet wavelength.

3. The pattern forming method according to claim 1, wherein the patterned imprint template includes a first pattern surface in a recessed region, the recessed region being on a first surface of the patterned imprint template that is substantially parallel to the substrate when the contacting of the uncured second resist is performed.

4. The pattern forming method according to claim 3, wherein the patterned imprint template includes an angled surface region which extends in a direction intersecting the first surface, the angled surface region including imprint patterns thereon.

5. The pattern forming method according to claim 1, wherein the substrate is substantially unpatterned when the dispensing of the uncured first resist material on to the substrate is performed.

6. The pattern forming method according to claim 1, wherein the second light comprises vacuum ultraviolet light and the second light does not pass through the patterned imprint template during the exposing of the cured first resist pattern to the second light.

7. The pattern forming method according to claim 1, wherein the second light comprises vacuum ultraviolet light and the second light passes through the patterned imprint template during the exposing of the cured first resist pattern to the second light.

8. The pattern forming method according to claim 1, wherein the first light is supplied from a first light source, and the second light is supplied from a second light source separate from the first light source.

9. The pattern forming method according to claim 1, wherein the dispensed uncured second resist material is exposed to the second light in the exposing of the cured first resist pattern to the second light.

10. The pattern forming method according to claim 1, wherein the exposing of the cured first resist pattern to the second light occurs after the dispensing of the uncured second resist material on to the cured first resist pattern, but before the contacting of the uncured second resist material with the patterned imprint template and the curing of the uncured second resist material.

11. The pattern forming method according to claim 1, wherein the curing of the uncured second resist material occurs with ultraviolet light at a wavelength substantially similar to the first light.

12. A lithographic pattern forming method, comprising:
    dispensing a pattern of an uncured first resist material on to a substrate;
    curing the uncured first resist material with a first light to form a cured first resist pattern on the substrate;
    dispensing an uncured second resist material on to the cured first resist pattern;
    exposing the dispensed uncured second resist material to a second light having a different wavelength from the first light; and
    contacting the uncured second resist material with a patterned imprint template and curing the uncured second resist material.

13. The lithographic pattern forming method according to claim 12, wherein the second light is a vacuum ultraviolet wavelength.

14. The lithographic pattern forming method according to claim 13, wherein the first light is an ultraviolet wavelength different from the second light.

15. The lithographic pattern forming method according to claim 12, wherein the exposing of the dispensed uncured second resist material to the second light occurs during the contacting of the uncured second resist material with the patterned imprint template.

16. The lithographic pattern forming method according to claim 12, wherein the exposing of the dispensed uncured second resist material to the second light occurs before the contacting of the uncured second resist material with the patterned imprint template.

17. The lithographic pattern forming method according to claim 12, wherein the first light is supplied from a first light source, and the second light is supplied from a second light source separate from the first light source.

18. The lithographic pattern forming method according to claim 12, wherein the patterned imprint template includes a first pattern surface in a recessed region, the recessed region being on a first surface of the patterned imprint template that is substantially parallel to the substrate when the contacting of the uncured second resist is performed.

19. The lithographic pattern forming method according to claim 18, wherein the patterned imprint template includes an angled surface region which extends in a direction intersecting the first surface, the angled surface region including imprint patterns thereon.

20. The lithographic pattern forming method according to claim 12, wherein the first and second resist materials are substantially the same materials in composition.

* * * * *